(12) United States Patent
Biebersdorf et al.

(10) Patent No.: US 12,294,039 B2
(45) Date of Patent: May 6, 2025

(54) OPTOELECTRONIC COMPONENT, SEMICONDUCTOR STRUCTURE AND METHOD

(71) Applicant: OSRAM Opto Semiconductors GmbH, Regensburg (DE)

(72) Inventors: Andreas Biebersdorf, Regensburg (DE); Stefan Illek, Donaustauf (DE); Felix Feix, Jena (DE); Christoph Klemp, Regensburg (DE); Ines Pietzonka, Donaustauf (DE); Petrus Sundgren, Lappersdorf (DE); Christian Berger, Marburg (DE); Ana Kanevce, Stuttgart (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 655 days.

(21) Appl. No.: 17/753,957

(22) PCT Filed: Mar. 26, 2020

(86) PCT No.: PCT/EP2020/058547
§ 371 (c)(1),
(2) Date: Mar. 18, 2022

(87) PCT Pub. No.: WO2021/052635
PCT Pub. Date: Mar. 25, 2021

(65) Prior Publication Data
US 2022/0376134 A1 Nov. 24, 2022

(30) Foreign Application Priority Data

Sep. 20, 2019 (DE) .................... 10 2019 125 349.7
Oct. 11, 2019 (DE) .................... 10 2019 127 425.7
Jan. 29, 2020 (WO) ................. PCT/EP2020/052191

(51) Int. Cl.
H01L 33/06 (2010.01)
H01L 33/00 (2010.01)
H01L 33/30 (2010.01)

(52) U.S. Cl.
CPC .......... *H01L 33/06* (2013.01); *H01L 33/0062* (2013.01); *H01L 33/0095* (2013.01); *H01L 33/30* (2013.01)

(58) Field of Classification Search
CPC . H01L 33/06; H01L 33/0062; H01L 33/0095; H01L 33/30
See application file for complete search history.

(56) References Cited

U.S. PATENT DOCUMENTS 4,897,614 A 1/1990 Nishio
4,979,002 A 12/1990 Pankove
(Continued)

FOREIGN PATENT DOCUMENTS

DE 19744793 A1 4/1998
DE 19751649 A1 5/1999
(Continued)

OTHER PUBLICATIONS

Buljan et al., "Ultra-Compact Multichannel Freeform Optics for 4xWUXGA OLED Microdisplays," Proc. SPIE 10676, Digital Optics for Immersive Displays, 9 pages (2018).
(Continued)

*Primary Examiner* — Mark W Tornow
(74) *Attorney, Agent, or Firm* — ArentFox Schiff LLP

(57) ABSTRACT

A semiconductor structure comprises an n-doped first layer, a p-doped second layer doped with a first dopant, and an active layer disposed between the n-doped first layer and the p-doped second layer and having at least one quantum well. The active layer of the semiconductor structure is divided into a plurality of first optically active regions, at least one
(Continued)

second region, and at least one third region. Here, the plurality of first optically active regions are arranged in a hexagonal pattern spaced apart from each other. The at least one quantum well in the active region comprises a larger band gap in the at least one second region than in the plurality of first optically active regions and the at least one third region, the band gap being modified, in particular, by quantum well intermixing. The at least one second region encloses the plurality of first optically active regions.

25 Claims, 9 Drawing Sheets

(56) References Cited

U.S. PATENT DOCUMENTS

| | | |
|---|---|---|
| 5,103,271 A | 4/1992 | Izumiya et al. |
| 5,526,063 A | 6/1996 | Joubert et al. |
| 5,537,171 A | 7/1996 | Ogino et al. |
| 5,858,814 A | 1/1999 | Goossen et al. |
| 6,048,751 A | 4/2000 | D'Asaro et al. |
| 6,316,286 B1 | 11/2001 | Trezza |
| 6,527,456 B1 | 3/2003 | Trezza |
| 6,881,982 B2 | 4/2005 | Okuyama et al. |
| 7,067,339 B2 | 6/2006 | Biwa et al. |
| 7,808,005 B1 | 10/2010 | Fattal et al. |
| 8,049,233 B2 | 11/2011 | Fukshima et al. |
| 8,349,116 B1 | 1/2013 | Bibl et al. |
| 8,536,026 B2 | 9/2013 | Park et al. |
| 8,816,324 B2 | 8/2014 | Fukui et al. |
| 9,318,645 B2 | 4/2016 | Tani et al. |
| 9,368,683 B1 | 6/2016 | Meitl et al. |
| 9,437,782 B2 | 9/2016 | Bower et al. |
| 9,444,015 B2 | 9/2016 | Bower et al. |
| 9,472,734 B1 | 10/2016 | Chen et al. |
| 9,520,537 B2 | 12/2016 | Bower et al. |
| 9,698,308 B2 | 7/2017 | Bower et al. |
| 9,705,042 B2 | 7/2017 | Bower et al. |
| 9,923,013 B1 | 3/2018 | Yamashita et al. |
| 9,991,423 B2 | 6/2018 | Bower et al. |
| 9,997,102 B2 | 6/2018 | Rotzoll et al. |
| 10,069,036 B2 | 9/2018 | Atanackovic |
| 10,147,849 B2 | 12/2018 | Xu et al. |
| 10,162,182 B2 | 12/2018 | Jepsen |
| 10,177,195 B2 | 1/2019 | Ahmed et al. |
| 10,224,460 B2 | 3/2019 | Bower et al. |
| 10,395,589 B1 | 8/2019 | Vahid Far et al. |
| 10,396,241 B1 * | 8/2019 | Perkins ................ H01L 33/025 |
| 10,405,406 B2 | 9/2019 | Liszt |
| 10,418,517 B2 | 9/2019 | Atanackovic |
| 10,446,719 B2 | 10/2019 | Bower et al. |
| 10,466,487 B2 | 11/2019 | Blum et al. |
| 10,490,695 B2 * | 11/2019 | Gomez-Iglesias .... H01L 33/007 |
| 10,522,787 B1 | 12/2019 | Montgomery et al. |
| 10,622,514 B1 | 4/2020 | Atanackovic |
| 10,833,225 B2 | 11/2020 | Bower et al. |
| 10,985,143 B2 | 4/2021 | Bower et al. |
| 11,156,759 B2 | 10/2021 | Brick et al. |
| 11,367,807 B2 | 6/2022 | Wada et al. |
| 11,513,275 B2 | 11/2022 | Brick et al. |
| 11,538,852 B2 | 12/2022 | Varghese et al. |
| 11,552,057 B2 | 1/2023 | Chae et al. |
| 2002/0072138 A1 | 6/2002 | Trezza et al. |
| 2002/0074553 A1 | 6/2002 | Starikov et al. |
| 2003/0013230 A1 | 1/2003 | Dudoff et al. |
| 2003/0141507 A1 | 7/2003 | Krames et al. |
| 2003/0168666 A1 | 9/2003 | Okuyama et al. |
| 2003/0189125 A1 | 10/2003 | Trierenberg |
| 2004/0146219 A1 | 7/2004 | Sathyanarayana |
| 2004/0189627 A1 | 9/2004 | Shirasaki et al. |
| 2005/0194598 A1 | 9/2005 | Kim et al. |
| 2005/0237488 A1 | 10/2005 | Yamasaki et al. |
| 2005/0264472 A1 | 12/2005 | Rast |
| 2006/0002247 A1 | 1/2006 | Kim et al. |
| 2006/0043402 A1 | 3/2006 | Suehiro et al. |
| 2006/0164345 A1 | 7/2006 | Sarma et al. |
| 2006/0192225 A1 | 8/2006 | Chua et al. |
| 2007/0057249 A1 * | 3/2007 | Kim ................ H01S 5/34333 257/14 |
| 2007/0096127 A1 | 5/2007 | Pattison et al. |
| 2008/0061304 A1 | 3/2008 | Huang et al. |
| 2008/0160725 A1 | 7/2008 | Byun et al. |
| 2009/0315054 A1 | 12/2009 | Kim et al. |
| 2010/0019693 A1 | 1/2010 | Hoogzaad et al. |
| 2010/0019697 A1 | 1/2010 | Korsunsky et al. |
| 2010/0163894 A1 | 7/2010 | Uemura et al. |
| 2010/0252103 A1 | 10/2010 | Yao et al. |
| 2010/0317132 A1 | 12/2010 | Rogers et al. |
| 2011/0151602 A1 | 6/2011 | Speier |
| 2011/0156070 A1 | 6/2011 | Yoon et al. |
| 2011/0156616 A1 | 6/2011 | Anderson et al. |
| 2011/0204327 A1 | 8/2011 | Hiruma et al. |
| 2011/0254043 A1 | 10/2011 | Negishi et al. |
| 2011/0263054 A1 | 10/2011 | Yu et al. |
| 2011/0297975 A1 | 12/2011 | Yeh et al. |
| 2012/0126229 A1 | 5/2012 | Bower |
| 2012/0223289 A1 | 9/2012 | Gwo et al. |
| 2012/0223873 A1 | 9/2012 | Ohta |
| 2012/0224148 A1 | 9/2012 | Natsumeda et al. |
| 2013/0063413 A1 | 3/2013 | Miyake |
| 2013/0063815 A1 | 3/2013 | Kubota |
| 2013/0082624 A1 | 4/2013 | Brassfield et al. |
| 2013/0119424 A1 | 5/2013 | Kang et al. |
| 2013/0154498 A1 | 6/2013 | Missbach |
| 2013/0249972 A1 | 9/2013 | Nishino et al. |
| 2013/0256708 A1 | 10/2013 | Jin et al. |
| 2013/0328066 A1 | 12/2013 | Sabathil et al. |
| 2014/0008677 A1 | 1/2014 | Zhu et al. |
| 2014/0054619 A1 | 2/2014 | Tseng et al. |
| 2014/0111559 A1 | 4/2014 | Yang et al. |
| 2014/0124806 A1 | 5/2014 | Lester |
| 2014/0131753 A1 | 5/2014 | Ishida et al. |
| 2014/0159064 A1 | 6/2014 | Sakariya et al. |
| 2015/0103070 A1 | 4/2015 | In et al. |
| 2015/0103404 A1 | 4/2015 | Rudy et al. |
| 2015/0162560 A1 | 6/2015 | Chen et al. |
| 2015/0186099 A1 | 7/2015 | Hall |
| 2015/0187991 A1 | 7/2015 | McGroddy et al. |
| 2015/0207399 A1 | 7/2015 | Li et al. |
| 2015/0213756 A1 | 7/2015 | Wacyk |
| 2015/0280086 A1 | 10/2015 | Jang et al. |
| 2015/0293302 A1 | 10/2015 | Czornomaz et al. |
| 2016/0013167 A1 | 1/2016 | Sakariya et al. |
| 2016/0155892 A1 | 6/2016 | Li et al. |
| 2016/0172253 A1 | 6/2016 | Wu et al. |
| 2016/0240159 A1 | 8/2016 | Ohkawa et al. |
| 2016/0315218 A1 | 10/2016 | Bour et al. |
| 2016/0341942 A1 | 11/2016 | Cheon et al. |
| 2016/0351539 A1 | 12/2016 | Bower et al. |
| 2017/0005151 A1 | 1/2017 | Kim et al. |
| 2017/0061878 A1 | 3/2017 | Park et al. |
| 2017/0082263 A1 | 3/2017 | Byrnes et al. |
| 2017/0084775 A1 | 3/2017 | Li et al. |
| 2017/0133357 A1 | 5/2017 | Kuo et al. |
| 2017/0170360 A1 * | 6/2017 | Bour ................ H01L 33/145 |
| 2017/0179097 A1 | 6/2017 | Zhang et al. |
| 2017/0179192 A1 | 6/2017 | Zhang et al. |
| 2017/0186740 A1 | 6/2017 | Cok et al. |
| 2017/0186908 A1 | 6/2017 | Robin et al. |
| 2017/0236885 A1 | 8/2017 | Koshihara et al. |
| 2017/0254518 A1 | 9/2017 | Vasylyev |
| 2017/0270852 A1 | 9/2017 | Meitl et al. |
| 2017/0278733 A1 | 9/2017 | Chang et al. |
| 2017/0287402 A1 | 10/2017 | Toyomura et al. |
| 2017/0338372 A1 | 11/2017 | Teraguchi et al. |
| 2017/0352309 A1 | 12/2017 | Chang et al. |
| 2017/0352313 A1 | 12/2017 | Miyake |
| 2018/0005562 A1 | 1/2018 | Lin et al. |
| 2018/0012540 A1 | 1/2018 | Hosoyachi et al. |
| 2018/0024412 A1 | 1/2018 | Kim et al. |
| 2018/0075798 A1 | 3/2018 | Nho et al. |
| 2018/0084614 A1 | 3/2018 | Bower et al. |
| 2018/0097033 A1 | 4/2018 | Ahmed et al. |

(56) References Cited

U.S. PATENT DOCUMENTS

| | | |
|---|---|---|
| 2018/0114878 A1 | 4/2018 | Danesh et al. |
| 2018/0180249 A1 | 6/2018 | Yamada et al. |
| 2018/0182298 A1 | 6/2018 | Jang et al. |
| 2018/0190712 A1 | 7/2018 | Xu et al. |
| 2018/0211595 A1 | 7/2018 | Takahashi et al. |
| 2018/0211945 A1 | 7/2018 | Cok et al. |
| 2018/0219144 A1 | 8/2018 | Perkins et al. |
| 2018/0226386 A1 | 8/2018 | Cok |
| 2018/0247586 A1 | 8/2018 | Vahid Far et al. |
| 2018/0269234 A1 | 9/2018 | Hughes et al. |
| 2018/0275410 A1 | 9/2018 | Yeoh et al. |
| 2018/0301433 A1 | 10/2018 | Robin et al. |
| 2018/0308832 A1 | 10/2018 | Shin et al. |
| 2018/0323116 A1 | 11/2018 | Wu et al. |
| 2018/0331258 A1 | 11/2018 | Halbritter et al. |
| 2018/0342492 A1 | 11/2018 | Lu |
| 2018/0358339 A1 | 12/2018 | Iguchi |
| 2018/0358340 A1 | 12/2018 | Wong et al. |
| 2018/0367769 A1 | 12/2018 | Greenberg |
| 2019/0012957 A1 | 1/2019 | Liu et al. |
| 2019/0012965 A1 | 1/2019 | Fu et al. |
| 2019/0013439 A1 | 1/2019 | Sung et al. |
| 2019/0044023 A1 | 2/2019 | Cheng et al. |
| 2019/0058081 A1 | 2/2019 | Ahmed et al. |
| 2019/0066571 A1 | 2/2019 | Goward |
| 2019/0066587 A1 | 2/2019 | Han |
| 2019/0113199 A1 | 4/2019 | Pellarin et al. |
| 2019/0113727 A1 | 4/2019 | Tamma |
| 2019/0115508 A1 | 4/2019 | Lin et al. |
| 2019/0148606 A1 | 5/2019 | Racz et al. |
| 2019/0165209 A1 | 5/2019 | Bonar et al. |
| 2019/0174079 A1 | 6/2019 | Anthony et al. |
| 2019/0195466 A1 | 6/2019 | Shimizu et al. |
| 2019/0229097 A1 | 7/2019 | Takeya et al. |
| 2019/0235234 A1 | 8/2019 | Hu et al. |
| 2019/0235677 A1 | 8/2019 | Liu et al. |
| 2019/0293939 A1 | 9/2019 | Sluka |
| 2019/0302917 A1 | 10/2019 | Pan |
| 2019/0305035 A1 | 10/2019 | Cho et al. |
| 2019/0305036 A1 | 10/2019 | Ahn et al. |
| 2019/0305185 A1 | 10/2019 | Lauermann et al. |
| 2019/0335553 A1 | 10/2019 | Ahmed et al. |
| 2019/0371777 A1 | 12/2019 | Iguchi |
| 2019/0378674 A1 | 12/2019 | Chou et al. |
| 2019/0383474 A1 | 12/2019 | Vasylyev |
| 2019/0386173 A1 | 12/2019 | Chen et al. |
| 2019/0393198 A1 | 12/2019 | Takeya |
| 2020/0052033 A1 | 2/2020 | Iguchi |
| 2020/0105184 A1 | 4/2020 | Shao et al. |
| 2020/0119233 A1 | 4/2020 | Dupont |
| 2020/0134624 A1 | 4/2020 | Zhang et al. |
| 2020/0203580 A1 | 6/2020 | Marutani |
| 2020/0219855 A1 | 7/2020 | Chen et al. |
| 2020/0227594 A1 | 7/2020 | Kuo |
| 2020/0251638 A1 | 8/2020 | Morris et al. |
| 2020/0342194 A1 | 10/2020 | Bhat et al. |
| 2020/0343230 A1 | 10/2020 | Sizov et al. |
| 2020/0356016 A1 | 11/2020 | Sampayan et al. |
| 2020/0357103 A1 | 11/2020 | Wippermann et al. |
| 2020/0366067 A1 | 11/2020 | David et al. |
| 2021/0005775 A1 | 1/2021 | Chen et al. |
| 2021/0043617 A1 | 2/2021 | Onuma et al. |
| 2021/0124247 A1 | 4/2021 | Mezouari et al. |
| 2021/0134624 A1 | 5/2021 | Zhang |
| 2021/0136966 A1 | 5/2021 | Jang et al. |
| 2021/0242370 A1 | 8/2021 | Lee et al. |
| 2021/0272938 A1 | 9/2021 | Chang et al. |
| 2021/0313497 A1 | 10/2021 | Pourquier |
| 2021/0375833 A1 | 12/2021 | Lee et al. |
| 2021/0391514 A1 | 12/2021 | Koyama et al. |
| 2022/0093833 A1 | 3/2022 | Takiguchi et al. |
| 2022/0102583 A1 | 3/2022 | Baumheinrich et al. |
| 2022/0115569 A1 | 4/2022 | Biebersdorf et al. |
| 2022/0123046 A1 | 4/2022 | Behringer et al. |
| 2022/0231193 A1 | 7/2022 | Boss et al. |
| 2022/0262850 A1 | 8/2022 | Behringer et al. |
| 2022/0262851 A1 | 8/2022 | Behringer et al. |
| 2022/0262852 A1 | 8/2022 | Behringer et al. |
| 2022/0271084 A1 | 8/2022 | Behringer et al. |
| 2022/0271085 A1 | 8/2022 | Behringer et al. |
| 2022/0285430 A1 | 9/2022 | Behringer et al. |
| 2022/0285591 A1 | 9/2022 | Biebersdorf et al. |
| 2022/0285592 A1 | 9/2022 | Biebersdorf et al. |
| 2022/0293829 A1 | 9/2022 | Biebersdorf et al. |
| 2022/0293830 A1 | 9/2022 | Biebersdorf et al. |
| 2022/0310888 A1 | 9/2022 | Biebersdorf et al. |
| 2022/0352436 A1 | 11/2022 | Biebersdorf et al. |
| 2022/0375991 A1 | 11/2022 | Behringer et al. |

FOREIGN PATENT DOCUMENTS

| | | |
|---|---|---|
| DE | 19911717 A1 | 9/2000 |
| DE | 10009782 A1 | 9/2001 |
| DE | 102006045702 A1 | 4/2008 |
| DE | 102007043877 A1 | 1/2009 |
| DE | 102007046339 A1 | 4/2009 |
| DE | 102005063159 B4 | 5/2009 |
| DE | 102012008833 A1 | 11/2012 |
| DE | 102013104273 A1 | 10/2014 |
| DE | 102017106755 A1 | 10/2018 |
| DE | 102017109083 A1 | 10/2018 |
| DE | 102018108022 A1 | 10/2018 |
| DE | 102017114369 A1 | 1/2019 |
| DE | 102018113363 A1 | 12/2019 |
| DE | 102018119312 A1 | 2/2020 |
| DE | 102018119376 A1 | 2/2020 |
| EP | 0488772 A1 | 6/1992 |
| EP | 1544660 A1 | 6/2005 |
| EP | 1553640 A1 | 7/2005 |
| EP | 1887634 A2 | 2/2008 |
| EP | 2323185 A2 | 5/2011 |
| EP | 2396818 A2 | 12/2011 |
| EP | 2430652 | 3/2012 |
| EP | 2609624 | 3/2012 |
| EP | 2477240 A1 | 7/2012 |
| EP | 2506321 A1 | 10/2012 |
| EP | 2642537 A2 | 9/2013 |
| EP | 2685155 A2 | 1/2014 |
| EP | 2750208 A2 | 7/2014 |
| EP | 2838130 A1 | 2/2015 |
| EP | 2924490 A2 | 9/2015 |
| EP | 2980866 A1 | 2/2016 |
| EP | 2986082 A1 | 2/2016 |
| EP | 3010048 A1 | 4/2016 |
| EP | 3031086 A1 | 6/2016 |
| EP | 2676528 B1 | 8/2017 |
| EP | 3226042 A1 | 10/2017 |
| EP | 2704215 B1 | 4/2018 |
| EP | 33673774 A1 | 8/2018 |
| JP | S642386 A | 6/1987 |
| JP | S62269385 A | 11/1987 |
| JP | H06244457 A | 9/1994 |
| JP | H11145519 A | 5/1999 |
| JP | 2002246647 A | 8/2002 |
| JP | 2004-228297 A | 8/2004 |
| JP | 2005244220 A | 9/2005 |
| JP | 2005346066 A | 12/2005 |
| JP | 2006263932 A | 10/2006 |
| JP | 2007264610 A | 10/2007 |
| JP | 2007324416 A | 12/2007 |
| JP | 2009141254 A | 6/2009 |
| JP | 2009186794 A | 8/2009 |
| JP | 2009260357 A | 11/2009 |
| JP | 2010272245 A | 12/2010 |
| JP | 2012510716 A | 5/2012 |
| JP | 2013048282 A | 3/2013 |
| JP | 2013110154 A | 6/2013 |
| JP | 2014019436 A | 2/2014 |
| JP | 2014110333 A | 6/2014 |
| JP | 2015099238 A | 5/2015 |
| JP | 2016174179 A | 9/2016 |
| JP | 2016208012 A | 12/2016 |
| JP | 2017152655 A | 8/2017 |
| JP | 2017-533453 A | 11/2017 |

(56) References Cited

FOREIGN PATENT DOCUMENTS

| | | |
|---|---|---|
| JP | 2017535966 A | 11/2017 |
| JP | 2018050082 A | 3/2018 |
| JP | 2018063975 A | 4/2018 |
| JP | 2018-191006 A | 11/2018 |
| JP | 2019009438 A | 1/2019 |
| JP | 2019029473 A | 2/2019 |
| KR | 20130052944 A | 5/2013 |
| WO | 2004084318 A1 | 9/2004 |
| WO | 2006035212 A1 | 4/2006 |
| WO | 2007001099 A1 | 1/2007 |
| WO | 2009082121 A2 | 7/2009 |
| WO | 2010019594 A2 | 2/2010 |
| WO | 2010132552 A1 | 11/2010 |
| WO | 2010149027 A1 | 12/2010 |
| WO | 2011069747 A1 | 6/2011 |
| WO | 2011117056 A1 | 9/2011 |
| WO | 2011160051 A2 | 12/2011 |
| WO | 2012014857 A1 | 2/2012 |
| WO | 2013026440 A2 | 2/2013 |
| WO | 2014047113 A1 | 3/2014 |
| WO | 2014093063 A1 | 6/2014 |
| WO | 2015138102 A1 | 9/2015 |
| WO | 2016025325 A1 | 2/2016 |
| WO | 2016054092 A1 | 4/2016 |
| WO | 2016060677 A1 | 4/2016 |
| WO | 2016151112 A1 | 9/2016 |
| WO | 2017087312 A1 | 5/2017 |
| WO | 2017111827 A1 | 6/2017 |
| WO | 2017120320 A1 | 7/2017 |
| WO | 2017120341 A1 | 7/2017 |
| WO | 2017197576 A1 | 11/2017 |
| WO | 2018117382 A1 | 6/2018 |
| WO | 2018123280 A1 | 7/2018 |
| WO | 2018179540 A1 | 10/2018 |
| WO | 2019079383 A1 | 4/2019 |

OTHER PUBLICATIONS

Fortuna, "Integrated Nanoscale Antenna-LED for On-Chip Optical Communication," UC Berkeley, 146 pages (2017).
Li et al., "Waveguiding in Vertical Cavity Quantum-Well Structure Defined by Ion Implantation," J. Lightwave Technol. 16, pp. 1498-1508 (1998).
Ogihara et al., "1200 Dots-Per-Inch Light Emitting Diode Array Fabricated by Solid-Phase Zinc Diffusion," IEICE Transactions on Electronics, 80;3, pp. 489-497 (1997).
Stevens et al., "Varifocal Technologies Providing Prescription and VAC Mitigation In HMDs Using Alvarez Lenses," Proc. SPIE 10676, Digital Optics for Immersive Displays, 18 pages (2018).
Tomioka et al., "Selective-Area Growth of III-V Nanowires and Their Applications," Journal of Materials Research, 26(17), pp. 2127-2141 (2011).
Waldern et al., "DigiLens Switchable Bragg Grating Waveguide Optics for Augmented Reality Applications," Proc. SPIE 10676, Digital Optics for Immersive Displays, 17 pages (2018).
Wheelwright et al., "Field of View: Not Just A Number," Proc. SPIE 10676, Digital Optics for Immersive Displays, 8 pages (2018).
Yu et al., "Hybrid LED Driver for Multi-Channel Output with High Consistency," 2015 IEEE 11th International Conference on ASIC (ASICON), Chengdu, 4 pages (2015).
Huang et al., "Metasurface Holography: From Fundamentals to Applications," Nanophotonics. 7(6), pp. 1169-1190 (2018).
International Search Report for International Patent Application No. PCT/EP2020/058997, mailed Mar. 5, 2021 (10 pages).
International Search Report for International Patent Application No. PCT/EP2020/058547, mailed Mar. 26, 2021 (9 pages).
Ron Mertens, "More details emerge on Samsung's QD-OLED TV Plans", available online at <https://www.oled-info.com/more-details-emerge-samsungs-qd-oled-tv-plans>, Dec. 8, 2018, 4 pages.
Volz et al., "Influence of annealing on the optical and structural properties of dilute N-containing III/V heterostructures," Journal of Crystal Growth, Jan. 2007, vol. 298, pp. 126-130.

* cited by examiner

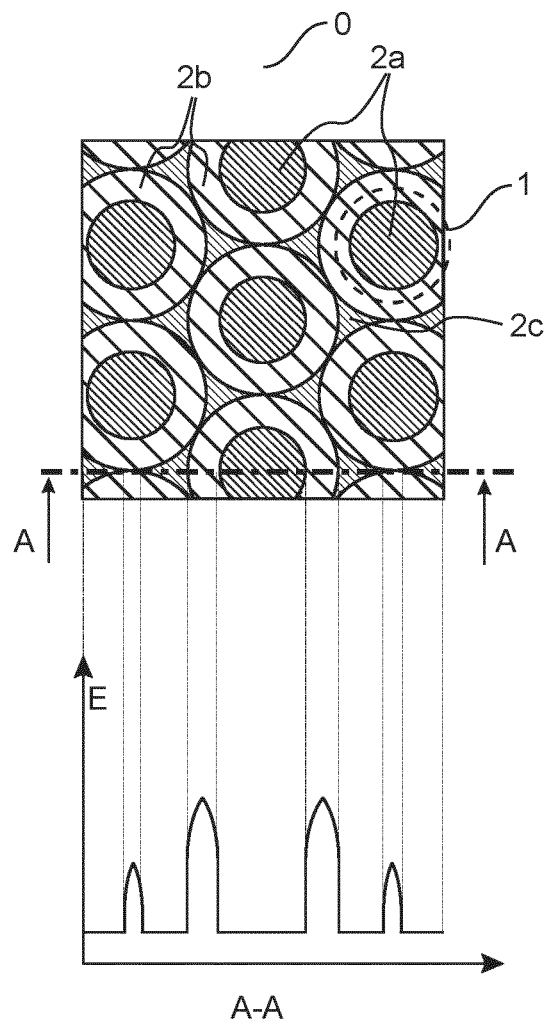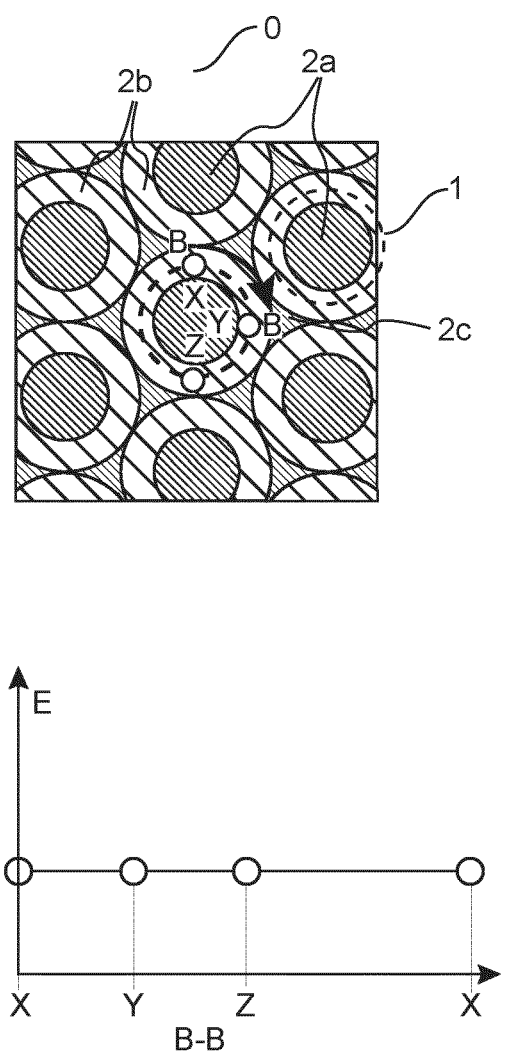
FIG. 7A
FIG. 7B

OPTOELECTRONIC COMPONENT, SEMICONDUCTOR STRUCTURE AND METHOD

This patent application is a 35 U.S.C. § 371 National Phase of PCT Application No. PCT/EP2020/058547, filed Mar. 26, 2020, which claims the priority of German application DE 10 2019 125349.7 dated Sep. 20, 2019, the priority of German application 10 2019 127425.7 dated Oct. 11, 2019, and the priority of international application PCT/EP2020/052191 dated Jan. 29, 2020, the disclosures of which are hereby incorporated by reference.

BACKGROUND

The present invention relates to the construction of a semiconductor structure for improving the low-current efficiency of optoelectronic lighting devices, and to a method of manufacturing the same. The invention also relates to an optoelectronic device.

A prerequisite for various applications is that optoelectronic components, i.e. so-called light-emitting diodes, have sufficient luminosity, i.e. can withstand relatively high current densities. At the same time, the efficiency should also be high or even increased at low currents.

One measure to improve the low-current behavior is quantum well intermixing, which is used in various fields. In this process, the bandgap in this area is changed by exchanging lattice atoms between the active layer designed as a quantum well and the barrier material surrounding it. This exchange process can be particularly efficient if suitable interfering atoms, in particular doping atoms, are introduced into the semiconductor.

Such local impurity diffusion and/or impurity induced quantum well intermixing are well established techniques to improve the performance of optoelectronic devices. Possible improvements are, for example, the reduction of contact resistance, the creation of transparent window areas for lasers, or the reduction of occurring surface recombination in an optoelectronic device.

However, in optoelectronic devices with impurity-induced quantum well intermixing, significant degradation, i.e. a marked reduction in output power after a short operating time, has been observed even at low electrical current levels. This is surprising in that such degradation does not occur at comparable current levels in devices without quantum well intermixing. In addition, local impurity diffusion and/or impurity-induced quantum well intermixing is used to improve the low-current efficiency of LEDs (light emitting diodes) in the InGaAlP (indium-gallium-aluminum-phosphorus) material system with square shape only. Here it is observed that the effectiveness of these barriers, together with the introduction of the impurities, has a strong influence on the aging behavior of the components and devices. This is particularly visible at higher loading current densities, especially when smaller devices are affected.

Therefore, there is a need to develop a semiconductor structure and process in which said is reduced.

The inventors realized that until now, geometric consideration to improve performance was only in the area of a single LED, but no action had yet been taken to improve this effect by geometrically arranging LEDs on a wafer basis or in groups of LEDs during the manufacturing of a semiconductor structure.

SUMMARY OF THE INVENTION

One aspect to improving Quantum well intermixing leading to an improved quality of optoelectronic components, both individually and in combination, e.g. on a wafer is presented by the following method.

For this purpose, a method for manufacturing a semiconductor device, in particular an optoelectronic device or an LED, is proposed, in which a semiconductor structure is provided in a first step. This semiconductor structure can be produced, inter alia, by growth of differently doped layers and/or layers of different material composition; and comprises, inter alia, a first n-doped layer, a second p-doped layer and an active layer with at least one quantum well arranged in between. The p-doped layer was provided with a first dopant.

In a second step, a mask is applied and patterned on the semiconductor structure and in particular on the p-doped layer. The mask is adjusted to protect a portion of the active layer intended for the generation of electromagnetic radiation from the penetration of a second dopant. The mask material can be formed either by a dielectric (silicon oxide, silicon nitride, . . . ), metal (Ti, . . . ) or semiconductor material.

The p-doped layer not covered by the patterned mask is then doped with the second dopant so that quantum well intermixing is generated in regions of the active layer over which no region of the patterned mask lies. The doping of the p-doped layer with the second dopant can be done, for example, by a gas phase diffusion using a precursor with the second dopant.

In other processes, the precursor is thermally decomposed in a gas phase reaction, the dopant is absorbed at the semiconductor surface and diffused into the semiconductor, and quantum well intermixing is generated. Since all these subprocesses comprise a different temperature dependence, the temperature range in which efficient quantum well intermixing can be realized is severely limited (typically for InP- or GaAs-based semiconductors: 520+/−20° C.)

According to the proposed principle, the steps of applying the dopant by precursor and diffusing are now specified. This creates a process sequence for efficient quantum well intermixing by a gas-phase diffusion, which enables an enlargement of the process window and thus an optimization of the process sequence for the realization of aging-stable optoelectronic devices.

This specified process sequence comprises the following steps in some aspects:
depositing the second dopant on the surface of the p-doped layer by decomposing the precursor at a first temperature selected such that substantially no diffusion of the second dopant occurs into the p-doped layer takes place; and
Diffusing the deposited second dopant into the p-doped layer at a second temperature higher than the first temperature.

The inventors have recognized that the process control of doping with the second dopant has a significant influence on reducing the charge carrier concentration in the areas, where a reduction in luminescence efficiency induced by impurities takes place over a longer period of time. This is due, among other things, to the fact that the process control can increase the dopant barrier in the active layer below the mask edge.

For this purpose, in the process control according to the proposed concept, the step of diffusion of the dopant-containing precursor in the gas phase is divided into the steps in some aspects:
depositing decomposition products comprising the second dopant on the surface of the semiconductor structure; and diffusing the second dopant into the semiconductor structure.

The separation allows the temperature to be freely selected for the diffusion step for the generation of quantum well intermixing and, in particular, allows to be increased to values at which surface occupation by the second dopant is no longer possible due to excessive desorption (>520° C.). This can advantageously be used to improve the aging behavior of optoelectronic devices.

The second dopant is of the same dopant type as the first dopant and is formed of Zn, Mg, etc., for example. The amount of the deposited second dopant can be chosen such that it diffuses substantially completely into the p-doped layer during the diffusion process at a second temperature. Thus, only an amount sufficient for diffusion and generation of quantum well intermixing is provided, but not beyond.

In a further aspect, the amount of second dopant deposited is thereby selected, for example, to form a barrier to lateral diffusion of charge carriers in regions of the active layer that are not covered by a region of the patterned mask, the barrier comprising a barrier created by the second dopant as well as a barrier created by quantum well intermixing.

In a further improvement of this aspect, the amount of the second dopant is selected such that in regions of the active layer that are not covered by a region of the patterned mask, a barrier to lateral diffusion of charge carriers created by the second dopant is greater than a barrier created by quantum well intermixing. Further, the amount of the second dopant may also be selected such that the bandgap in the active layer in the regions underlying the patterned mask is smaller than the bandgap in the active layer in the regions over which no region of the patterned mask lies.

In another aspect, the doping process is followed by a final temperature step at a third temperature that is higher than the second temperature. Without further supply of the second dopant, in some aspects the semiconductor is thus subjected to an annealing step at this third temperature. This subsequent annealing step at a higher temperature and without the second dopant is such that the significant improvement in low current efficiency achieved with the doping step is maintained over an extended period of operation.

The inventors have recognized that the process of supplying the second dopant at a first temperature and then diffusing the second dopant at a second temperature is both causal to the generation of quantum well intermixing and important to subsequent degradation. In this process, atoms of the second dopant diffuse into the semiconductor layer stack and into the active layer, or quantum well, where they can replace atoms of the original crystal lattice. These are either atoms of the first dopant, but also atoms of the actual lattice material. The atoms displaced to interstitial sites are mobile and are believed to play a significant role in the degradation of the optoelectronic device. An additional annealing step at a simultaneous higher third temperature and during which no further dopant is added will reduce any subsequent reduction in efficiency.

For the annealing step, in a further aspect, suitable environmental conditions are provided by offering a support pressure with an element forming the crystal lattice (e.g., by providing a suitable further precursor). By suitably selecting this element, the lattice atoms displaced by the second dopant are provided with a reaction opportunity at the surface of the semiconductor, thereby preventing the free mobility of these atoms. If the displaced lattice atoms are, for example, group III atoms, this process can be initiated by a supporting pressure with a group V element. Accordingly, the interstitial atoms generated by the diffusion process diffuse to the surface during the annealing step according to the invention and are bound there. By reducing the number of interstitial atoms participating in the degradation mechanism, the lifetime of the device increases considerably.

Accordingly, according to this aspect, the annealing process comprises the steps of: Providing a further precursor comprising an element from the fifth main group, in particular P or As; and/or forming a layer of a III-V semiconductor material on the surface of the p-doped layer.

In a step of annealing, the precursor can be added right at the beginning or only after the second process parameters have been reached. Also, the concentration of the precursor can change during the annealing step so that sufficient precursor material is available for saturation of the lattice atoms displaced by the dopant.

In a further aspect, this further precursor may particularly include the elements phosphorus or arsenic, especially in compounds such as PH3, AsH3, TBAs or TBP.

Another aspect deals with process parameters that may be selected differently during the steps of deposition, diffusion, and annealing. In one aspect, the parameters include at least one of the following, or a combination thereof: Temperature, temperature change over a defined period of time during one of the aforementioned steps, pressure, pressure change over a defined period of time during one of the aforementioned steps, composition and flow of a gas, in particular a precursor, and time duration of the annealing step.

For example, the process parameters include a defined first temperature during the delivery of the second dopant selected such that substantially no diffusion of the second dopant into the p-doped layer occurs during the deposition of the second dopant on the p-doped layer, a second temperature during the diffusion process of the second dopant that is, for example, higher than the first temperature, and a third temperature during the annealing step that is again higher than the second temperature. In other words, one temperature during the annealing step is greater than the two temperatures during the quantum well intermixing generation. Also, the durations of the supply of the second dopant, the diffusion step, and the annealing step may be different.

In another aspect, a second dopant is used that is different from the first dopant. For example, Zn or Mg may be used as the second dopant. For example, a III-V semiconductor material is used as the material system for the semiconductor structure. This may have at least one of the following material combinations: InP, Alp, GaP, GaAlP, InGaP, InAlP, GaAlP or InGaAlP. Likewise, other III-V semiconductors can be considered as material systems, for example with As.

Another aspect relates to an optoelectronic device. This comprises a semiconductor structure with a III-V semiconductor material. The semiconductor structure comprises an n-doped layer, a p-doped layer, and an active layer having at least one quantum well disposed therebetween. The p-doped layer comprises a first dopant. Further, the device comprises a light-generating region, in particular central region in the active layer, laterally surrounded by a second region in the active layer. The bandgap of the second region is thereby larger than that of the central region, since a second dopant is introduced into the second region, which has caused quantum well intermixing in the at least one quantum well of the active layer located in the second region.

Due to this impurity-induced local quantum well intermixing in the second region, but not in the first region, barriers are formed in the active layer which limit a lateral movement of charge carriers in the quantum well in the active layer of the optoelectronic device to this first region of the active layer. This largely prevents, for example, current for operating the optoelectronic device from flowing in the edge regions of the optoelectronic device, i.e., through the second region enclosing the first region. This reduces non-radiative recombination of charge carriers caused by non-radiative recombination centers or high non-radiative surface recombination in the second region, thus leading to improved device performance.

In a further aspect, a patterned mask is disposed on the p-doped layer such that it covers a first sub-region of the p-doped layer. In a sub-region of the p-doped layer not covered by the mask, a second dopant is introduced to create quantum well intermixing in the active layer disposed below this sub-region. The size of the mask is essentially the same size as the first sub-region.

The choice of support pressure during the annealing step of the invention converts material displaced to interstitial sites by the second dopant into a layer covering portions of the surface. The diffusion process during the annealing step appears to remove the material from interstitial sites so that it no longer leads to non-radiative recombination centers in the quantum well, and thus the efficiency of the optoelectronic device does not decrease even over a long period of time. Accordingly, a layer of a III-valent material of the III-V semiconductor material and an element of a precursor material, in particular P or As, is formed on a surface of the intermixed portion of the p-doped layer.

In addition to a process-related change that leads to an improvement in the performance in the area of a single light-emitting diode, it also makes sense to provide for measures that are necessary for a Quantum well intermixing on wafer level to bring about further improvement. Optoelectronic components are usually produced as a large number of such structures at wafer level. The production can be monolithic, or the devices can be designed for later separation. In the former case, quantum well intermixing can also act as a barrier against electrical crosstalk, while in the latter case quantum well intermixing can already be used during production to modify the areas that will later form the edge.

In one aspect, a semiconductor structure is presented comprising an n-doped first layer, a p-doped second layer doped with a first dopant, and an active layer. The latter is disposed between the n-doped first layer and the p-doped second layer and includes at least one quantum well. According to the invention, the active layer can be divided into a plurality of first regions, in particular optically active regions, and at least one second region. In particular, the plurality of first optically active regions and the at least one second region are adjacent to each other. Further, the plurality of first regions are spaced apart from each other in a hexagonal pattern and are enclosed by the at least one second region that includes quantum well intermixing. The quantum well intermixing may thereby be generated as per the process described above.

One region each of the plurality of first, in particular optically, active regions of the semiconductor structure can thereby form, for example, one part each of an optoelectronic component. Accordingly, the semiconductor structure can be formed from a plurality of individual optoelectronic components, which can subsequently be separated by, for example, an etching process through the epitaxial layers or by laser cutting and subsequent substrate removal.

The plurality of first regions is, for example, circular in shape. Compared to a square device structure, the absence of corners means that the introduction of interference and quantum well intermixing along the edge of the later light emitting diode is more homogeneous. This in turn means that non-radiative recombination in the edge region of the second region of the device can be reduced and, accordingly, the performance of each individual optoelectronic device can be increased. Nevertheless, production is advantageously carried out at wafer level.

Circular in this context means that a polygon with a number of corners greater than/equal to 6 corners is also possible, for example 8, 10 or more corners, since for this shape a positive effect of performance enhancement of an optoelectronic device can already be seen. Likewise, the term circular may also include elliptical, as well as oval and other roundish convex shapes.

By locally applying a mask to the semiconductor structure and with the aid of, for example, a diffusion process, a second dopant enters the active layer in regions and quantum well intermixing occurs in the corresponding region in the quantum well present. The region in which quantum well intermixing occurs forms the at least one second region. Accordingly, the semiconductor structure comprises a second dopant, in particular a dopant different from the first dopant arranged in the p-doped second layer, which is arranged substantially uniformly in the at least one second region.

In contrast, in the plurality of first regions, quantum well intermixing is largely prevented by the application of the mask. More specifically, quantum well intermixing does not occur in the plurality of first regions. Accordingly, after the diffusion process, no second dopant is arranged in the plurality of first regions to the greatest extent possible, and thus, accordingly, no second dopant is arranged in the active layer in the quantum well in the region of the first regions.

The division into first and second regions and the associated quantum well intermixing makes it possible to use the first regions as optically active regions in the later operation of the components, in particular of light-emitting diodes. Accordingly, in the following, the first areas are referred to as the first optically active areas.

Due to this impurity-induced local quantum well intermixing in the at least one second region, but not in the plurality of first optically active regions, electronic barriers are formed in the active layer by the changing band structure, which limit a lateral movement of charge carriers in the quantum well in the active layer of the semiconductor structure to the plurality of first optically active regions of the active layer. This largely prevents, for example, current for driving an optoelectronic device from flowing in the edge regions of the optoelectronic device, i.e., through the second region enclosing the first region. Since non-radiative recombination centers often exist in the edge regions of a singulated structure, charge carriers are thus kept away from these edge regions, resulting in improved device performance.

In practice, however, the introduction of the impurities and thus quantum well intermixing depends on the size of the open area over which the substance to be diffused is introduced. Accordingly, in the case of a hexagonal arrangement of the plurality of first optically active regions, larger areas, i.e. local maxima with a higher impurity concentration, are formed on the semiconductor structure in the spaces between each three first optically active regions arranged in a triangle than in the areas directly between two adjacent first optically active regions. These maxima result from the fact that the diffusion process is more efficient in the region of larger areas exposed to the second dopant than in smaller spaces between two first optically active regions covered, for example, by a mask. This effect is undesirable in some situations, since to improve the low-current efficiency of optoelectronic devices it is important to achieve a very homogeneous diffusion pattern in the semiconductor structure.

Accordingly, in a further aspect, a semiconductor structure is presented comprising an n-doped first layer, a p-doped second layer interspersed with a first dopant, and an active layer. The latter is disposed between the n-doped first layer and the p-doped second layer and comprises at least one quantum well. According to the invention, the active layer can be divided into a plurality of first regions, in particular optically active regions, at least one second region and at least one third region. In particular, the plurality of first optically active regions and the at least one second region are adjacent to each other. Further, the plurality of first optically active regions are spaced apart in a hexagonal pattern and are enclosed by the at least one second region having quantum well intermixing. Additionally, the at least one third region is disposed in the spaces between the plurality of first optically active regions and the second region, and is thereby particularly adjacent to the at least one second region.

In contrast to the aspect described above, the active layer is thereby subdivided into the at least one third region in addition to the plurality of first optically active regions and the at least one second region.

The at least one third region is arranged in such a way that the regions, in which local maxima with a higher impurity concentration would occur according to the aspect described above, are made inaccessible for quantum well intermixing, for example by applying a mask, and thus in these regions, as well as in the plurality of first optically active regions, no quantum well intermixing occurs to the greatest possible extent. Accordingly, after the diffusion process in the at least one third region as well as in the plurality of first optically active regions no second dopant is arranged to the greatest possible extent.

Further, the at least one second region surrounds the plurality of first optically active regions such that each of the plurality of first optically active regions is concentrically surrounded by a portion of the at least one second region or individually by one of a plurality of second regions. Accordingly, the at least one second region results, for example, from contiguous annular segments each disposed about one of the plurality of first optically active regions, or from a plurality of annular individual surfaces each concentrically disposed about one of the plurality of first optically active regions. Similarly, the term annular may also include circular, elliptical, as well as oval and other rounded convex shapes arranged substantially concentrically around and fully surrounding the plurality of first optically active regions.

In this regard, the at least one third region is adjacent to the at least one second region. Accordingly, the at least one third region may comprise a continuous mesh-like surface disposed about the plurality of annular second regions. In a further aspect, however, a plurality of third regions may each at least approximately map the shape of a deltoid curve. For example, this may be formed by exactly three second regions arranged in a triangle, respectively, which are at least approximately circular or annular in shape. Likewise, the plurality of third regions can be circular in shape and in each case be arranged in the center of three first regions arranged in the triangle, which are at least approximately circular in shape.

The decisive factor in the arrangement of the at least one third region is that, for example, by applying a mask such as a dielectric or, for example, a photoresist mask, local maxima with a higher impurity concentration in the second region are reduced during the diffusion process in order to thus achieve a diffusion pattern in the semiconductor structure that is as homogeneous as possible.

The quantum well intermixing can be generated by doping the second region with a second dopant such as magnesium, zinc, or cadmium (Mg, Zn, Cd). However, this is not intended to be a limiting choice for the dopant, but any other dopant of the same type conceivable to the skilled person can be used for the doping.

In a further aspect, the diffusion process for generating the quantum well intermixing in the at least one second region may result in the second dopant being formed not only in the active layer in the second region, but also in the second p-doped layer and also at least partially in a region of the n-doped layer adjacent to the active layer. However, this is not necessarily to be understood as meaning that the regions in the second p-doped layer and in the first n-doped layer in which the second dopant is formed are congruent with the at least one second region in the active layer, but congruence is also possible.

In a further aspect, a semiconductor structure is proposed in which the at least one second region comprises a substantially uniform bandgap generated by quantum well intermixing. This means that in this region the energy of the band gap comprises a largely constant value and only towards the edges of the region the band gap becomes larger or smaller.

In contrast, the at least one quantum well in the plurality of first optically active regions and in the at least one third region comprises a smaller bandgap than that in the at least one second region. Accordingly, the barrier generated according to any of the above aspects results between the plurality of first optically active regions and the second region and between the at least one third region and the second region. The transition between the band gaps may be possible as a step with a sharp edge or as a smoothly flowing transition.

In a further aspect, the plurality of first optically active regions and the at least one third region comprise a substantially identical bandgap. This results, among other things, from the at least one quantum well in the plurality of first optically active regions and the at least one third region, having substantially no quantum well intermixing and thus comprising substantially no second dopant in these regions.

According to a further aspect, the semiconductor structure, which may be formed from a plurality of individual optoelectronic devices, is singulated into the plurality of optoelectronic devices by, for example, an etching process through the epitaxial layers or by laser cutting and subsequent substrate removal. In this regard, the cutout of each of the plurality of optoelectronic devices is circular, for example, and includes at least one of the plurality of first optically active regions, and a portion of the at least one second region. The first optically active region and the second region are thereby arranged in particular concentrically in the circular cutout. Accordingly, it follows that the at least one third region of the semiconductor structure is not part of the plurality of individual optoelectronic devices, and thus is in particular the reject of the singulation process.

DESCRIPTION OF THE FIGURES

In the following, the invention is explained in detail with reference to several drawings by means of embodiment examples.

FIGS. 7A and 7B represent a top view of a further embodiment of a semiconductor structure suitable for light emission with associated bandgap cross-sectional profile according to some aspects of the proposed concept;

DETAILED DESCRIPTION

FIGS. 1A to 1F show individual steps of a manufacturing process in which, by suitable selection of the process parameters, a further Quantum well intermixing improvement can be generated. It was recognized that application with simultaneous diffusion causes dopant to diffuse into the active layer under a mask, but does not cause quantum well intermixing there. This leaves an increased impurity density in the active layer under a mask intended for light emission, which leads to an accelerated aging process and a deterioration of the properties.

Figure 1A:
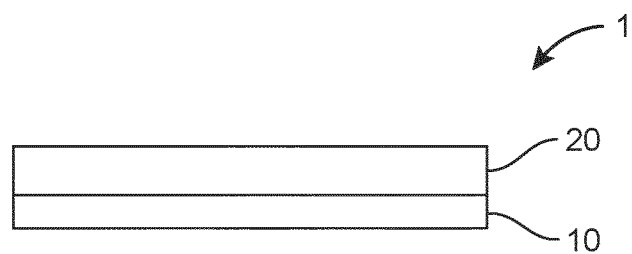
FIGS. 1A to 1F show an embodiment comprising various process steps for fabricating a semiconductor structure using quantum well intermixing according to some aspects of the concept presented.
Figure 1B:
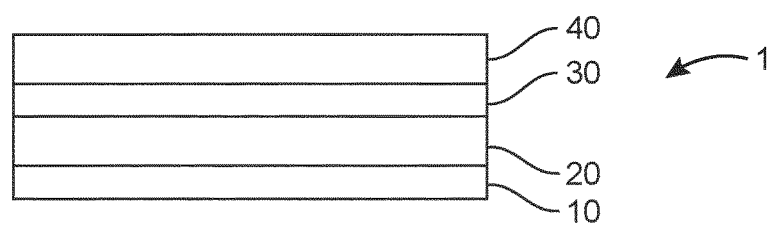
Figure 1C:
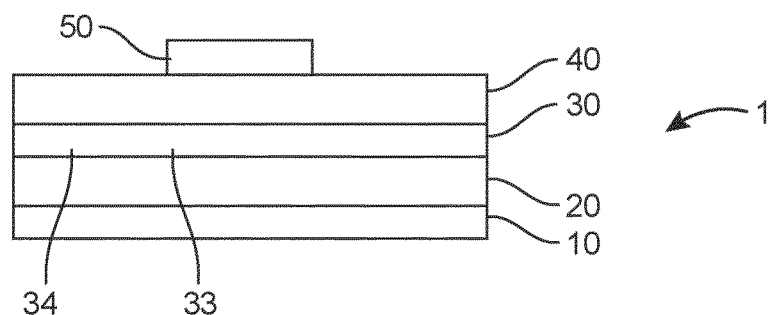

In FIGS. 1A to 1C, a semiconductor structure 1 is shown which is subjected to further process steps. In FIG. 1A, a growth substrate 10 is provided, for example a GaAs substrate, which is prepared for further growth steps. These further steps may include the deposition of sacrificial layers, passivation layers or even conformal layers to different crystal structures. Likewise, the substrate may already contain, or be prepared for, leads contacts or even circuits.

An n-doped layer 20 based on a III-V material system is then deposited on the prepared substrate 10. The deposition is carried out in a MOCVD reactor, but other processes disclosed in this application can also be used for this purpose. For example, In, Ga, Al, or a combination thereof together with phosphorus P is used as the material. The exemplary InGaAlP layer 20 is n-doped and can also be provided (not further shown here) with further layers and/or dopants to ensure good electrically conductive contact and low sheet resistance in the n-doped layer 20.

In FIG. 1B, an active layer 30 is subsequently deposited. This comprises at least one quantum well in which radiative recombination takes place in an operation of the finished device and thus light is generated. The at least one quantum well in the active layer 30 may likewise comprise a layer combination from the III-V semiconductor system, for example consisting of InGaAlP layers with different Al content. Next, a p-doped layer 40 is formed on the active layer 30. For this purpose, a first dopant is used, for example Mg or Zn. As with the n-doped layer 20, doping can be performed during the fabrication process by adding the dopant at the desired concentration. This has the advantage that doping profiles can be generated in the layers already during growth, whereby on the one hand the desired electrical properties can be better adjusted and on the other hand interference points are reduced by more uniform crystal growth.

After providing the semiconductor structure 1 in the previous steps, a mask 50 is now applied to the p-doped layer in FIG. 1C and structured accordingly. As shown, the patterned mask 50 covers a partial area on the surface of the p-doped layer and thus also lies over a first partial area 33 of the active layer. An adjacent partial area 34 of the active layer is not covered by mask 50. After patterning of the mask 50, doping of the p-doped layer with a second dopant is carried out by gas phase diffusion using a precursor with first and second process parameters. The second dopant is, for example, formed from Zn, e.g. from an organic Zn compound.

Figure 1D:
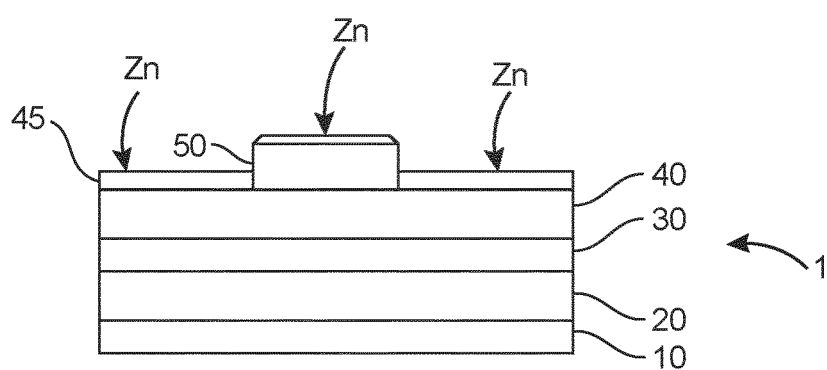

The process parameters for this second step include, among others, temperature, pressure and concentration of the second dopant and can also change during a predetermined period of time. They are selected in such a way that the second dopant, after decomposition of the precursor, is first deposited as layer 45 on the surface of the semiconductor structure and forms a thin layer there, but does not or hardly diffuse into the p-doped layer. For this purpose, for example, the temperature is chosen lower than in a later diffusion process. To provide the second dopant, the dopant is obtained from a decomposition of a precursor in the gas phase. This is done in an MOCVD or MOPVD reactor. The advantage of such a step is that the wafer remains in the reactor between the individual process steps and does not have to be transported. The resulting structure with a thin layer of Zn or other material as a second dopant is shown in FIG. 1D.

Figure 1E:
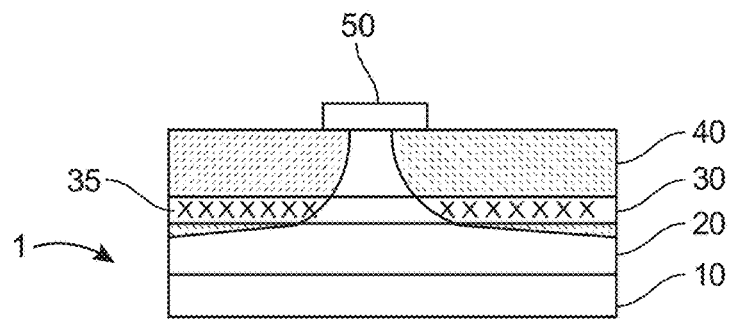

According to FIG. 1E, a separate diffusion process takes place after the dopant is deposited on the surface. The diffusion process is controlled by the process parameters such that the second dopant diffuses through the layer 40 into the active layer and the quantum well. In some cases, it may still diffuse slightly into the boundary region of the n-doped layer. During this process, the second dopant enters the region under the mask by diffusion in the layer 40 (stochastically distributed). In contrast, the first partial region 33 of the active layer under the mask is not interspersed with dopant. Rather, a sharp edge is formed there which, surprisingly, essentially coincides with the projection of the mask 50 into the active layer.

The process parameters are chosen such that diffusion generates intermixing in the quantum well of the second subregion in the active layer, where the energy gap of the quantum well is increased. In the boundary region between the first and second subdomains, the quantum well intermixing decreases sharply over a short distance, resulting in a relatively steep energy barrier.

By separating the deposition of the dopant and the subsequent diffusion step, a better control of the individual processes is achieved. In most cases, the deposition of the dopant takes place at a lower temperature than the subsequent diffusion. Thus, on the one hand, the amount of dopant provided can be better adjusted and, on the other hand, the diffusion is independent of the gas phase reaction. In the later separate diffusion step, a suitable temperature profile is set so that a doping profile is established in which the diffusion barrier for charge carriers created by the dopant is close to the energy barrier created by quantum well intermixing.

Figure 1F:
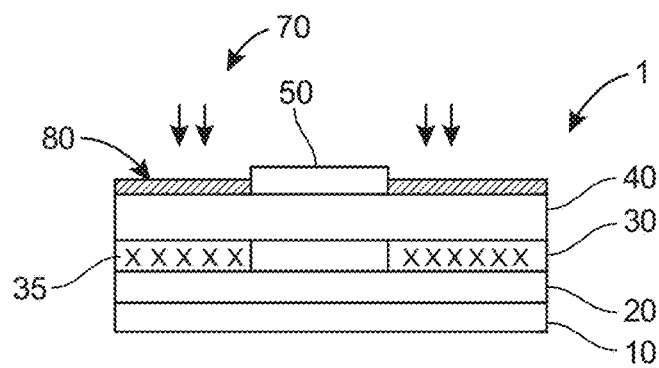

After completion of this procedure, the process now proceeds to an optional annealing step, as shown in FIG. 1F. Here, third process parameters are set, which include, in the embodiment example, a higher temperature and the addition of a further precursor 70. This aspect is also described in detail in this application. Through the previous diffusion process, the diffused Zn has displaced other atoms of the crystal lattice from their places and taken their place. The displaced atoms may reside on interstitial sites. It appears that these subsequently remain mobile, possibly forming recombination centers for non-radiative recombination. Their motion could thus cause them to migrate to the first subregion 33, where they could drastically reduce the efficiency of the device. This is supported by the observation that the efficiency drops early on even at low current densities.

Due to the temperature increase and the possibly optional, suitable choice of the precursor, the lattice atoms displaced by the diffusion step are bound to the surface. As a result, the surface acts as a sink for the interstitial atoms. In simpler terms, the changed process parameters may preferentially diffuse the displaced atoms from the active layer through the p-doped layer to the surface, reducing the concentration of potential non-radiative interferents in the active layer. It was found that using a precursor with a Vth main group material such as phosphorus P or arsenic As results in a significant increase in lifetime.

Figure 2:
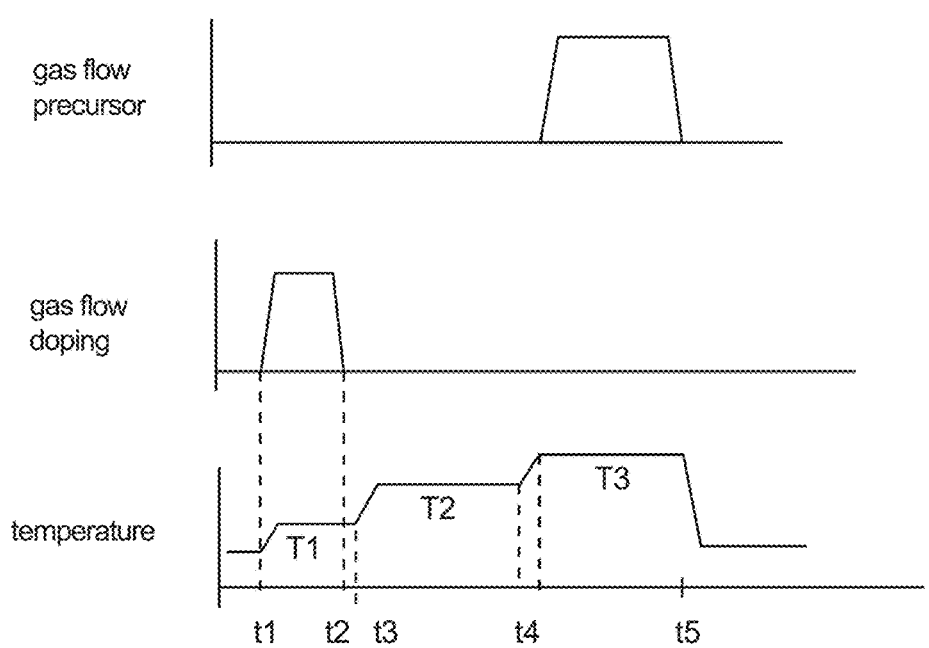
FIG. 2 shows an exemplary course of various process parameters during an execution of the process according to the proposed principle.

FIG. 2 shows qualitatively the time course of a selection of the process parameters, in detail the temperature T, the gas flow of the second dopant and the gas flow of the further precursor during the annealing phase. Between the time period t1 and t2, on the one hand, the temperature is kept at a first temperature T1 and, moreover, the dopant is added so that it can be deposited on the surface of the semiconductor structure. The temperature T1 is chosen in such a way that diffusion of the dopant into the semiconductor body does not occur or occurs only to a very small extent. During this time, the further precursor is not added. At time t2, the dopant is switched off, while the temperature T1 is still maintained until time t3, which is somewhat later.

After time t3, the temperature is increased to the value T2. The temperature increase starts the diffusion process, i.e. the dopant deposited on the surface diffuses into the p-doped layer. The temperature profile is kept essentially constant in this embodiment example, but non-constant temperature profiles are also conceivable. Depending on the temperature profile, a dopant profile is thus set. In a next step, the atoms displaced by the dopant are now healed out, i.e. removed from the p-doped layer or the active layer and the quantum well by a third temperature T3 over a period of time. For this purpose, in addition to an increase in temperature, the further precursor is added, the decomposition product of which combines with the displaced atoms at the surface. The resulting concentration gradient of mobile displaced atoms removes them from the quantum well of the active layer and binds them to the surface.

Figure 3:
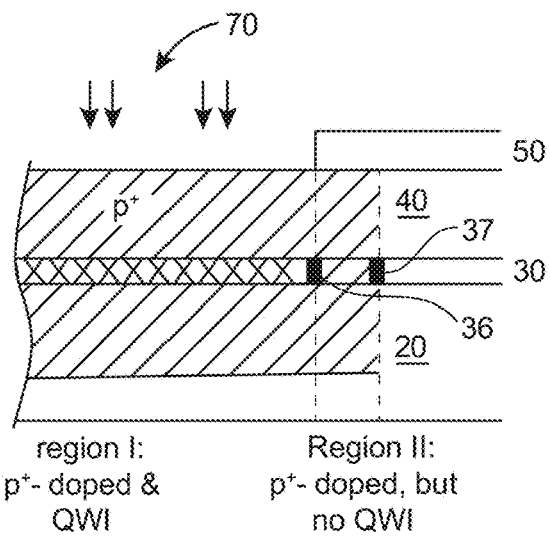
FIG. 3 shows a section of a semiconductor structure to explain various aspects of the concept presented.

FIG. 3 shows an overview of essential aspects for a possible explanation of the proposed principle. During the diffusion of the dopant, an additional concentration of dopant material is formed in the p-doped layer. When incorporated into the crystal lattice, this dopant displaces atoms of the original semiconductor (e.g., the trivalent component) to interstitial sites. These interstitial atoms cause quantum well intermixing in the active layer, increasing the band gap. Here, the localized region of quantum well intermixing is dictated by the mask, i.e., no quantum well intermixing occurs in the region below the mask as shown in FIG. 3. However, diffusion of the dopant also results in increased doping in the region marked "Region II", forming a barrier to the lateral diffusion of charge carriers in the quantum well. This barrier is already partially below the mask and is thus locally offset from the boundary of quantum well intermixing. Thus, there are two barriers reducing the lateral diffusion of charge carriers, on the one hand caused by the increased doping and on the other hand by a quantum well intermixing.

As shown in FIG. 3, the boundary 36 of quantum well intermixing and the boundary 37 of additional p-doping are locally offset, i.e. they do not coincide. From the point of view of carrier diffusion, this means that an increase in the barriers also occurs gradually. The separation between deposition of the dopant and diffusion now allows a change of the diffusion profile by a free choice of a suitable temperature profile during the diffusion process. Thus, for example, the boundary 37 can be pushed towards the boundary 36. This makes the barrier for carrier diffusion steeper at the boundary of the mask 50. Likewise, the impurity density due to the diffused material or even the displaced atoms in the active layer is reduced by making the process parameters more precise. Additionally or alternatively, the electrical activation of the second dopant and thus the barrier caused by the additional p-doping can be increased by optimized process parameters during the diffusion process, which leads to a stronger reduction of the lateral carrier diffusion.

Figure 4:
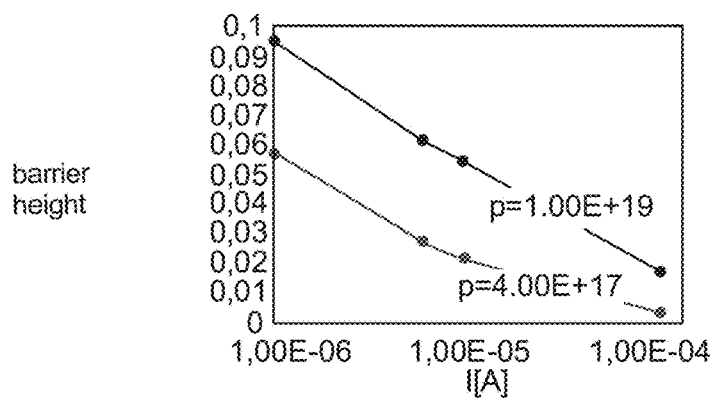
FIG. 4 is a diagram illustrating the barrier height as a function of operating current at different dopants to explain the concept presented.

FIG. 4 shows a simulation of the height of the doping barrier for light-emitting diodes as a function of the doping concentration at low currents. The increased doping shows a significant increase of the doping barrier by a factor of almost two. Thus, charge carriers are effectively kept away from the edge region, but also from the regions with increased number of impurities due to the introduced second dopant.

Figure 5:
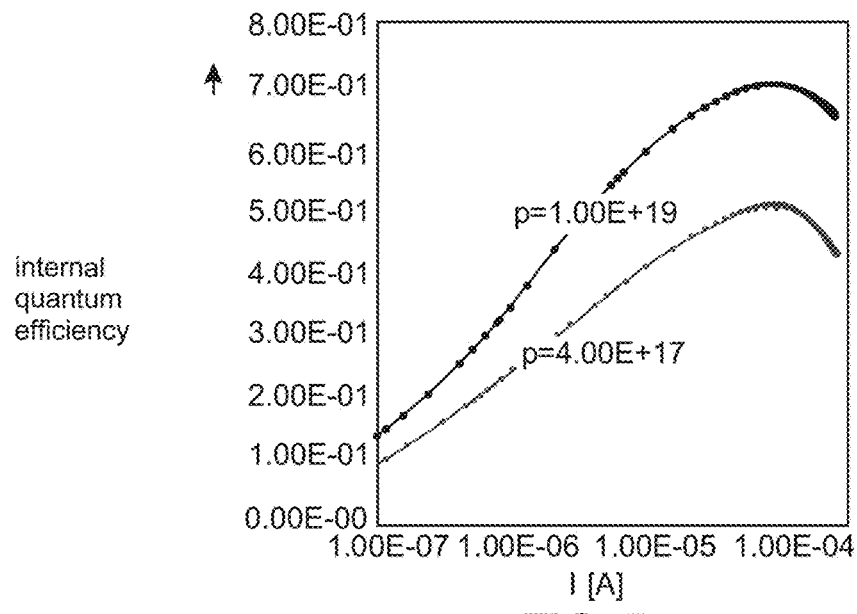
FIG. 5 is another diagram illustrating the quantum efficiency at different barrier heights to explain the presented concept.

This results in a higher internal quantum efficiency. FIG. 5 shows a diagram of the internal quantum efficiency versus current at different dopant concentrations. The improved maximum at higher concentrations for a current in the range of approx. 0.1 mA can be clearly seen.

With the proposed principle and various measures, an improvement of an optoelectronic device is achieved in both low-current and high-current efficiency. Impurities in the optically active region of an active layer are reduced. At the same time, charge carriers can be kept away from the edge of the element due to the higher diffusion barriers in the edge region of a device (or around the active layer), thus reducing the amount of non-radiating surface recombination.

In addition to a geometrical consideration for improving the performance in the area of a single LED, the following examples show how to improve a Quantum well intermixing on wafer level. Several structures of optoelectronic devices are produced as single devices or in monolithic form on wafer level, independent of their later use. By the above described Zn diffusion and other measures, improvements in low and high current efficiency can be achieved by lowering the impurity density in the area of the later active layer and by permanently binding or saturating impurity atoms.

Figure 6A:
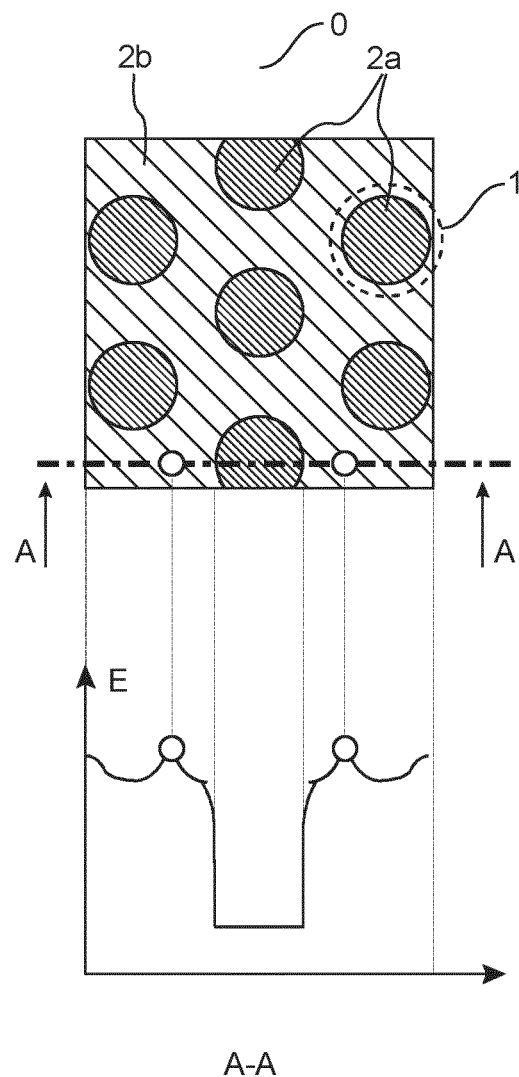
FIGS. 6A and 6B each illustrate a top view of a first embodiment of a semiconductor structure suitable for light emission and associated cross-sectional profiles of the bandgap of the semiconductor structure according to some aspects of the concept presented.

FIG. 6A shows a top view of a section of a first embodiment of a semiconductor structure 0, as well as the corresponding cross-sectional profile of the energy of the bandgap of the semiconductor structure along the section axis A-A. A plurality of first optically active regions 2a and a second region 2b are formed in the semiconductor structure 0. The plurality of first optically active regions 2a are thereby arranged in a hexagonal pattern spaced apart from each other, and the one second region 2b surrounds the plurality of first optically active regions 2a and is arranged in the spaces therebetween.

Furthermore, each optically active region 2a of the plurality of first optically active regions 2a of the semiconductor structure 0 forms a part of each of a plurality of optoelectronic devices 1. Here, the optoelectronic devices are regarded as light emitting diodes. The plurality of first optically active regions 2a may be formed, for example, by applying a mask or, for example, by applying mask segments possibly having the same or similar shape and size. Subsequently, a second dopant b is applied to the exposed second region 2b around the mask or around the mask segments, respectively, so that quantum well intermixing can take place in this region. Due to the diffusion of the second dopant and the associated quantum well intermixing in the second region, the energy of the band gap changes in this region compared to the regions in which no quantum well intermixing takes place.

The section of the semiconductor structure 0 shown in FIG. 6A and the curve of the bandgap energy along the section axis A-A derived therefrom show the curve of the bandgap energy in the regions 2a and 2b. From this it can be seen that the energy of the band gap in the second region 2b is larger than in the first optically active regions 2a. A decrease of the band gap energy results from the second region 2b towards the first optically active region 2a and, in a mirrored manner, an increase of the band gap energy results from the first optically active region 2a towards the second region 2b.

However, this and similar progressions in the following is to be considered as a qualitative progression only and does not represent absolute values or ratios of the energy of the band gap in the plurality of first optically active regions 2a and the second region 2b. Likewise, the transition region between the second and the first optically active region may also vary and be both somewhat shallower and steeper. The only decisive factor is that a largely sharp edge is formed in the transition region of the plurality of first optically active regions 2a to the second region 2b and that the energy of the band gap in the plurality of first optically active regions 2a is smaller than the energy of the band gap in the second region 2b.

Concomitantly, this means in other words that a dopant concentration of the second dopant b in the second region 2b is greater than the dopant concentration of the second dopant b in the plurality of first optically active regions 2a.

Furthermore, it is shown in FIG. 6A that the energy of the band gap in the second region 2b does not have a constant value, but shows local maxima of the energy of the band gap in the regions where the largest possible distance between the plurality of first regions 2a occurs. This is due to the fact that the diffusion process and thus the quantum well intermixing proceeds more efficiently in the region of larger areas exposed to the second dopant b than in smaller gaps between two first optically active regions 2a covered, for example, by a mask.

Figure 6B:
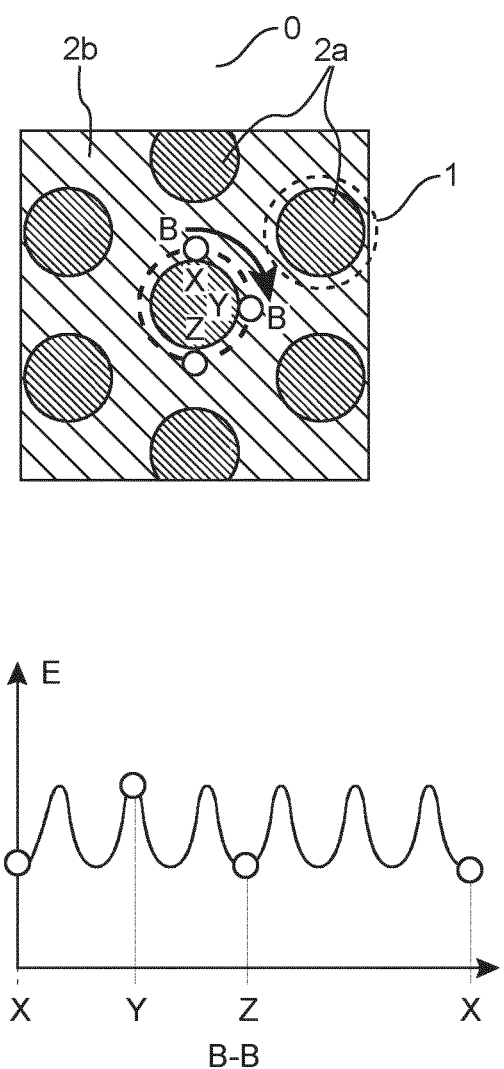

The section of the semiconductor structure 0 shown in FIG. 6B and the course of the bandgap energy along the section axis (B-B) derived therefrom show the course of the bandgap energy along the circumference of an optoelectronic component 1, with the section axis running through the second region 2b. According to the above explanation, the energy of the band gap in the second region 2b does not have a constant value, but comprises maxima in the regions where the largest possible distance between the plurality of first regions 2a occurs and minima, in the regions where the smallest possible distance between the plurality of first regions 2a occurs. In FIG. 6B, the regions of local maxima of the bandgap energy of the semiconductor structure are exemplarily denoted by Y, and the regions of local minima of the bandgap energy of the semiconductor structure are exemplarily denoted by X and Z.

In practice, however, it is desirable to achieve as homogeneous and constant a bandgap energy as possible in the second region 2b of the semiconductor structure 0 and correspondingly along the circumference of an optoelectronic device 1. Therefore, in the following, among others, the three embodiments (FIGS. 7A and 7B, 8A and 8B and 9A and 9B) are presented to counteract the effect of local maxima of the bandgap energy in the semiconductor structure 0. FIGS. 7A and 7B, 8A and 8B, and 9A and 9B each show a top view of an embodiment of the semiconductor structure 0 according to the invention and an associated cross-sectional profile of the bandgap energy of the semiconductor structure along the intersection axes A-A and B-B.

In addition to the example of a structure in FIGS. 6A and 6B, at least one further third region 2c is formed here in addition to the plurality of first optically active regions 2a and the at least one second region 2b. The at least one third region 2c is again arranged in the spaces between the plurality of first optically active regions 2a.

More specifically, FIG. 7A shows a section of a semiconductor structure 0 having a plurality of first optically active regions 2a, a second region 2b, and a plurality of third regions 2c. The plurality of first optically active regions 2a are spaced apart from each other in a hexagonal pattern as described above. The second region 2b surrounds the plurality of first optically active regions 2a in such a manner that each of the plurality of first optically active regions 2a is annularly and/or concentrically surrounded by the second region 2b. The second area 2b thereby divides into ring segments, for example, and is connected to the next adjacent ring segment of the second area 2b, for example, only in a punctiform manner. The plurality of third regions 2c is formed in the form of a deltoid curve by three of the ring segments of the second region 2b in each case. The plurality of first optically active regions 2a and third regions 2c can be formed, for example, by applying a mask or, for example, by applying mask segments possibly of the same or similar shape and size. Subsequently, a second dopant b is applied to the exposed second region 2b around the mask or around the mask segments, respectively, so that quantum well intermixing can take place in this region.

The section of the semiconductor structure 0 further shown in FIG. 7A and the energy of the band gap thereof along the section axis A-A shows the energy of the band gap in the regions 2a, 2b and 2c. From this, it can be seen that the band gap in the second region 2b is larger than in the first optically active regions 2a and third regions 2c. In the areas where the axis A-A intersects the second area 2b respectively, a local increase in the band gap can be seen. According to the area of the second area 2b intersected by the axis A-A, a higher or lower value results for energy of the band gap in each case.

However, this gradient is to be regarded as a qualitative gradient only and does not represent absolute values or ratios of the energy of the bandgap of the plurality of first optically active regions 2a, the second region 2b, and the plurality of third regions 2c. Likewise, the transition regions between the first optically active region, the second region 2b, and the third regions 2c may also vary and be both somewhat shallower and steeper.

The only decisive factor is that a largely sharp edge is formed in the transition region from the plurality of first optically active regions 2a to the second region 2b and in the transition region from the third regions 2c to the second region 2b, and that the energy of the band gap in the plurality of first optically active regions 2a and third regions 2c is smaller than the energy of the band gap in the second region 2b. Concomitantly, in other words, the dopant concentration of the second dopant b in the second region 2b is larger than the dopant concentration of the second dopant b in the plurality of first optically active regions 2a and third regions 2c.

The section of the semiconductor structure 0 shown in FIG. 7B and the course of the bandgap energy along the section axis B-B derived therefrom show the course of the bandgap energy along the circumference of an optoelectronic component 1. The section axis runs through the second region 2b. Contrary to the illustration in FIG. 6B, the energy of the band gap in the second region 2b exhibits a less pronounced variation. By introducing the plurality of third regions 2c, it is achieved that in the region of the interstices of three each of the plurality of first optically active regions 2a, the local maxima of the bandgap energy in the semiconductor structure 0 are less pronounced. Thus, a more uniform bandgap energy can be achieved in the second region 2b. This in turn leads to an increase in the performance of the optoelectronic devices 1.

Figure 8A:
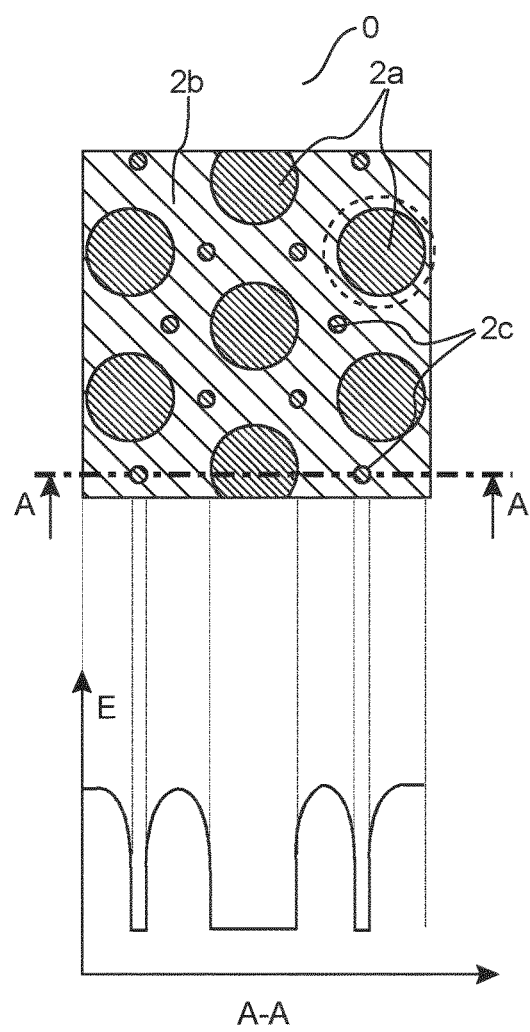
FIGS. 8A and 8B are a top view of a third embodiment according to some aspects of the proposed concept with associated cross-sectional profile of the band gap.
Figure 8B:
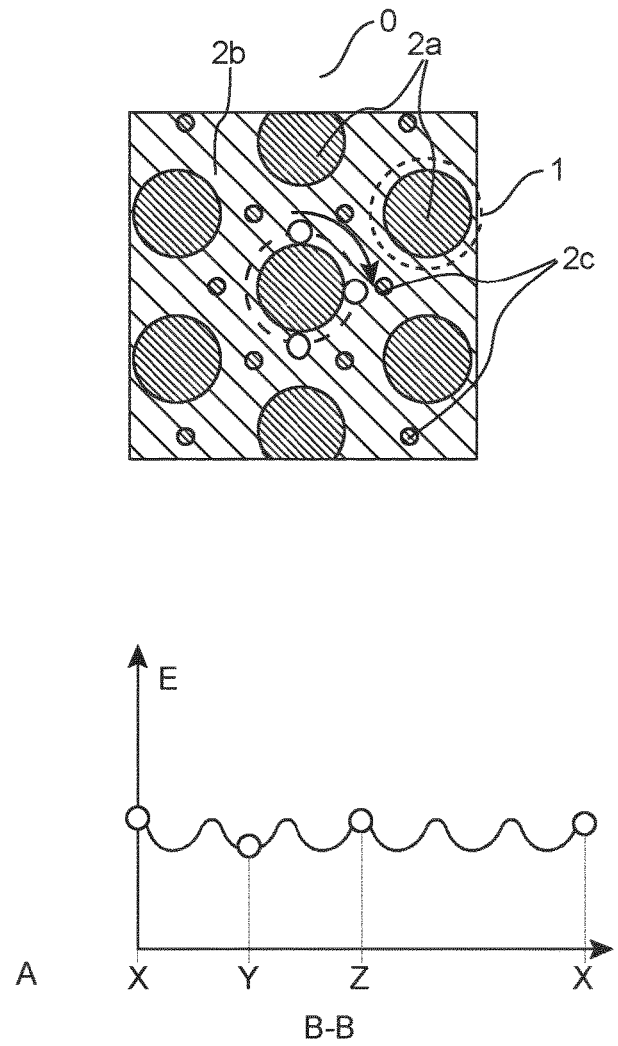

A further embodiment of the semiconductor structure 0 according to the invention and the course of the energy of the band gap in the semiconductor structure 0 along the intersection axes A-A and B-B derived therefrom are shown in FIGS. 8A and 8B.

Therein, the plurality of third regions 2c are each circular in shape and are disposed at the center of each three of the plurality of first optically active regions 2a. Likewise, the term circular may also include elliptical, as well as oval and other round convex shapes. This arrangement of the plurality of third regions 2c serves, in a manner analogous to that shown in FIGS. 7A and 7B, to reduce local maxima of the deposited second dopant b on the semiconductor structure 0 so as to achieve a substantially uniform dopant concentration in the second region 2b. The third regions 2c shown in FIG. 8A, which are circular in shape and are arranged in the center of three of the plurality of first optically active regions 2a in each case, already show an increase in the performance of the optoelectronic components 1. Accordingly, the second region 2b does not result as a continuous ring segment, but fills the space between the plurality of first optically active regions 2a and third regions 2c.

The plurality of first optically active regions 2a and third regions 2c can be formed, for example, by applying a mask or, for example, by applying mask segments possibly of the same or similar shape and size. For this purpose, a second dopant b is applied to the exposed second region 2b around the mask or around the mask segments, respectively, so that quantum well intermixing can take place in this region.

The section of the semiconductor structure 0 further shown in FIG. 8A and the course of the energy of the band gap along the section axis A-A derived therefrom show the energy of the band gap in the regions 2a, 2b and 2c. From this, it can be seen that the energy of the band gap in the second region 2b is larger than in the first optically active regions 2a and third regions 2c. In the regions where the axis A-A intersects the second region 2b, respectively, a local increase of the band gap can be seen. Likewise, the transition areas between the first area, the second area 2b and the third areas 2c can also vary and be both somewhat flatter and steeper.

The only decisive factor is that a largely sharp edge is formed in the transition region from the plurality of first optically active regions 2a to the second region 2b and in the transition region from the third regions 2c to the second region 2b, and that the energy of the band gap in the plurality of first optically active regions 2a and third regions 2c is smaller than the energy of the band gap in the second region 2b. Concomitantly, in other words, the dopant concentration of the second dopant b in the second region 2b is larger than the dopant concentration of the second dopant b in the plurality of first optically active regions 2a and third regions 2c.

The further section of the semiconductor structure 0 shown in FIG. 8B and the course of the bandgap energy along the section axis indicated by the arrow derived therefrom show the course of the bandgap energy along the circumference of an optoelectronic component 1. The section axis runs through the second region 2b. As shown in FIG. 7B, the bandgap energy in the second region 2b again comprises a substantially constant value.

Since the plurality of third regions 2c each cover a smaller area than the plurality of third regions 2c of the embodiment in FIG. 7A, more pronounced local maxima result in the regions where the largest possible distance to the plurality of first regions 2a and third regions 2c occurs. Correspondingly, local minima also result in the areas where the smallest possible distance between the plurality of first areas 2a and third areas occurs. In FIG. 8B, the regions of local maxima of the bandgap energy of the semiconductor structure are exemplarily designated by X and Z, and the regions of local minima of the bandgap energy of the semiconductor structure are exemplarily designated by Y.

It is decisive that in comparison to the embodiment in FIG. 6A, due to the introduction of the plurality of third regions 3c, the local maxima of the bandgap energy in the semiconductor structure 0 are smaller in amount, so that a comparatively homogeneous and constant energy of the bandgap prevails along the circumference of an optoelectronic component 1 or within the second region 2b in the semiconductor structure 0. This in turn already leads to an increase in the performance of the optoelectronic components 1.

Furthermore, FIG. 8B shows that one optically active region 2a of each of the plurality of first optically active regions 2a of the semiconductor structure 0 forms a part of each optoelectronic device 1.

Figure 9A:
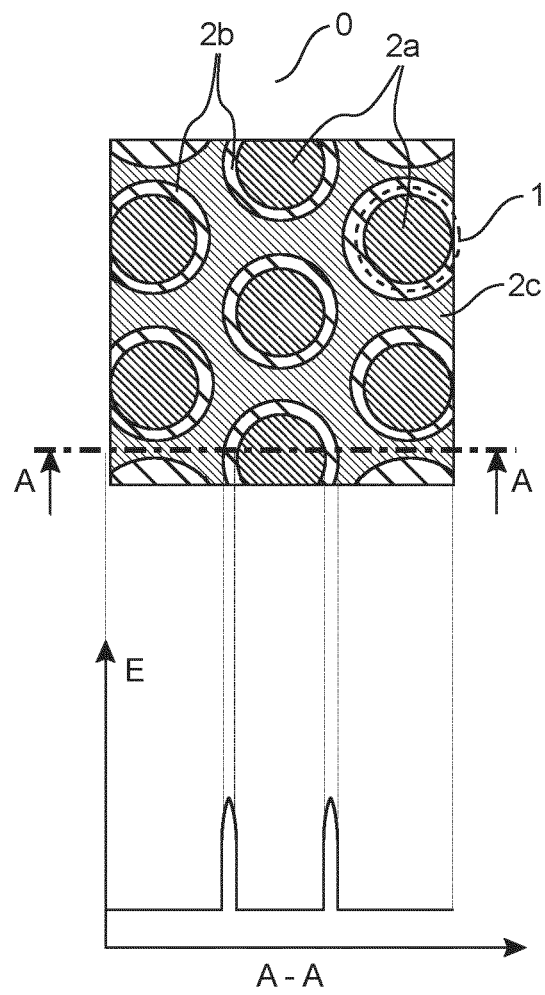
FIGS. 9A and 9B show a top view of a fourth embodiment of the semiconductor structure and associated cross-sectional profiles of the bandgap of the semiconductor structures, as implemented in various aspects.
Figure 9B:
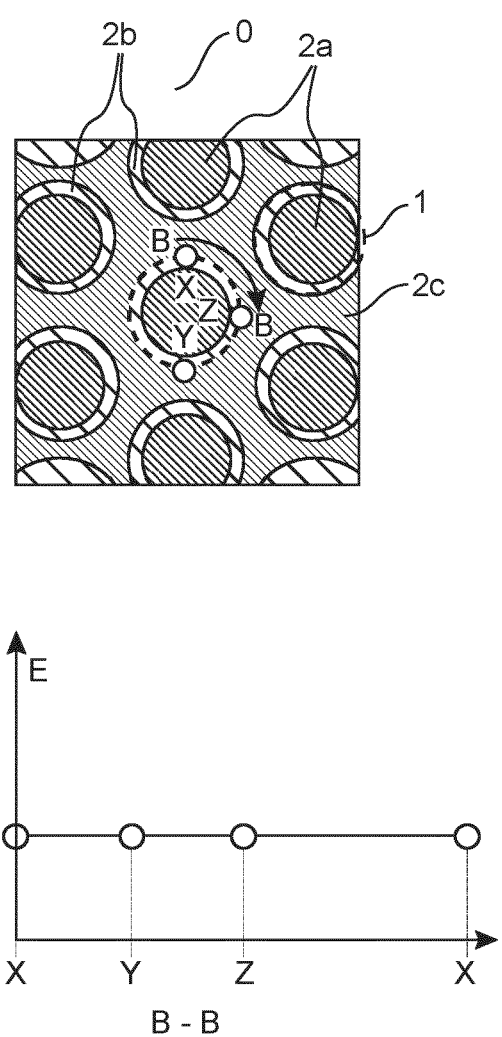

A further embodiment of the semiconductor structure 0 according to the invention and the course of the energy of the band gap in the semiconductor structure 0 along the intersection axes A-A and B-B derived therefrom are shown in FIGS. 9A and 9B. The plurality of first optically active areas 2a are each concentrically surrounded by a second area 2b. Accordingly, there is a plurality of second areas 2b, each of which is arranged in a ring or circle around one of the plurality of first optically active areas 2a. Likewise, the term annular or circular may also include elliptical, as well as oval and other roundish convex shapes.

Further, the semiconductor structure 0 comprises a third region 2c disposed in the spaces between the plurality of first optically active regions 2a and second regions 2b. The plurality of first optically active regions 2a and the third region 2c can be formed, for example, by applying a mask or, for example, by applying mask segments possibly having the same or similar shape and size. For this purpose, a second dopant b is applied to the exposed second regions 2b around the mask or around the mask segments, respectively, so that quantum well intermixing can take place in this region.

This annular arrangement of the plurality of second regions 2b around one each of the plurality of first optically active regions 2a and the third region 2c prevents local maxima of the applied second dopant b from forming in the region of the spaces between three each of the first optically active regions 2a. Thus, a substantially uniform dopant concentration can be achieved in the plurality of second regions 2b. This in turn leads to the fact that a substantially uniform quantum well intermixing can take place in the plurality of second regions 2b, which leads to an increase in the performance of the optoelectronic devices 1.

The course of the bandgap energy along the intersection axis A-A shown in FIG. 9A shows that the bandgap energy in the second region 2b is greater than in the first optically active region 2a and the third region 2c. In the areas where the axis A-A intersects the second area 2b in each case, a local increase in the band gap can be seen.

However, this gradient is to be regarded as a qualitative gradient only and does not represent any absolute values or ratios between the energy of the band gap of the plurality of first optically active regions 2a, the second region 2b and the third region 2c. Likewise, the transition regions between the first optically active region, the second region 2b and the third region 2c can also vary and be both somewhat flatter and steeper.

The only decisive factor is that a largely sharp edge is formed in the transition region from the plurality of first optically active regions 2a to the second regions 2b and in the transition region from the third region 2c to the second regions 2b, and that the energy of the band gap in the plurality of first optically active regions 2a and in the third region 2c is smaller than the energy of the band gap in the second regions 2b.

In other words, this means that the dopant concentration of the second dopant b in the second regions 2b is greater than the dopant concentration of the second dopant b in the plurality of first optically active regions 2a and the third region 2c.

The section of the semiconductor structure 0 shown in FIG. 9B and the course of the bandgap energy along the cut axis B-B derived therefrom show the course of the bandgap energy along the circumference of an optoelectronic component 1. The cut axis runs through the second region 2b in this case.

As shown in FIGS. 6B, 7B and 8B, the energy of the band gap in the second region 2b comprises a largely constant value. By introducing the third region 2c, it is avoided that local maxima of the applied second dopant b are formed in the region of the interstices of three first optically active regions 2a, respectively, and thus no local maxima of the band gap energy in the semiconductor structure 0 are formed. Thus, a substantially uniform energy of the band gap in the second region 2b can be achieved.

Figure 10A:
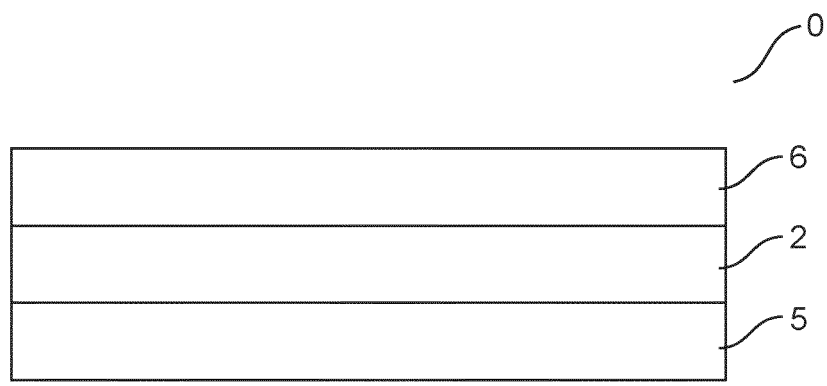
FIGS. 10A to 10C illustrate a layered structure and a method for manufacturing one or more optoelectronic devices, in particular LEDs according to some aspects of the concept presented.
Figure 10B:
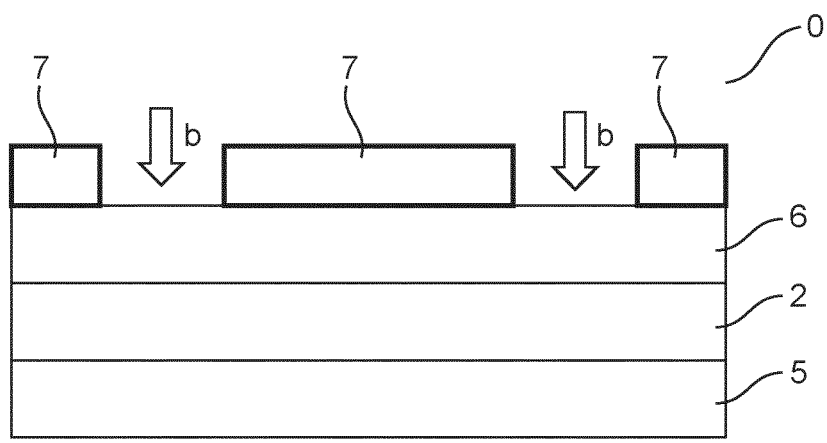
Figure 10C:
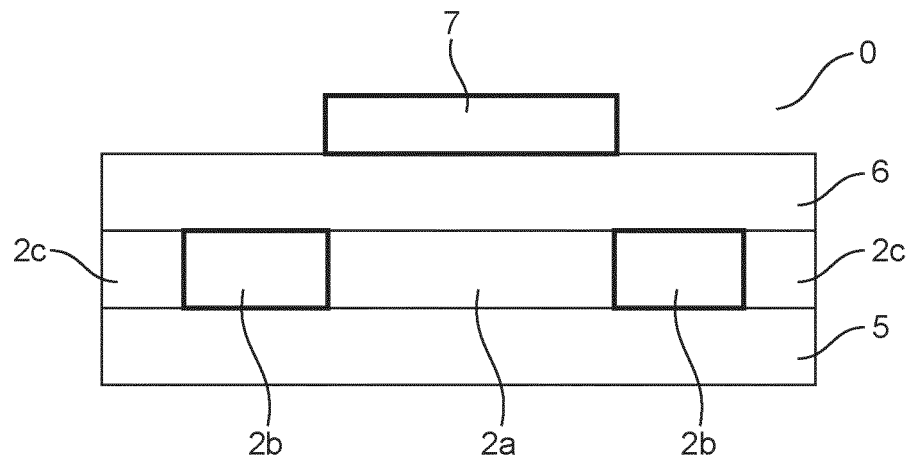

FIGS. 10A, 10B and 10C show the layer structure and correspondingly the fabrication of a semiconductor structure 0 as shown in FIGS. 7A, 8A and 9A. The semiconductor structure 0 comprises an n-doped first layer 5, a p-doped second layer 6 mixed with a first dopant and an active layer 2, which is arranged between the n-doped first layer 5 and the p-doped second layer 6 and which comprises at least one quantum well. The layers are epitaxially deposited, for example, on a supporting substrate not shown here. In addition to the layers shown here, further layers, contact layers, sacrificial layers or the like may be provided.

FIG. 10B shows the next step, in which a structured mask 7 is applied. The mask is perforated in some places so that dopant b is introduced there. The diffusion of the second dopant b into the active layer 2 causes the quantum well intermixing described above.

By applying a mask or mask segments 7, for example a dielectric or photoresist mask, to the surface of the p-doped second layer 6 and the subsequent diffusion process, the structure shown in FIG. 10C is formed. It shows a number of optically active regions below the mask 7 with surrounding second regions 2b and the at least one third region 2c. The structure and the structure result as mentioned from the structuring of the applied mask 7. The second dopant b diffuses through the p-doped second layer 6 and into the active layer 2 and forms the regions 2a,2b and 2c therein. Accordingly, the regions 2a, 2b and 2c in the active layer 2 result in the form of a projection of the mask or mask segments 7, which is applied to the surface of the p-doped second layer 6, in the active layer 2.

The plurality of first optically active regions 2a and the at least one third region 2c result as the regions which are located in direct projection below the mask or the mask segments 7, respectively, and into which essentially no second dopant b diffuses due to the mask or the mask segments 7, respectively.

Accordingly, the at least one second region 2b results as the region which is located in direct projection below the region which is exposed to the second dopant b around the mask or the mask segments 7 as a free surface. Consequently, in the at least one second region 2b, the second dopant b diffuses into the second p-doped layer 6, into the active layer 2 and, depending on the doping profile and process parameters, partly also into a region of the n-doped layer 5 adjacent to the active layer 2.

As a result, the at least one second region 2b has the second dopant b and thus quantum well intermixing.

Figure 11:
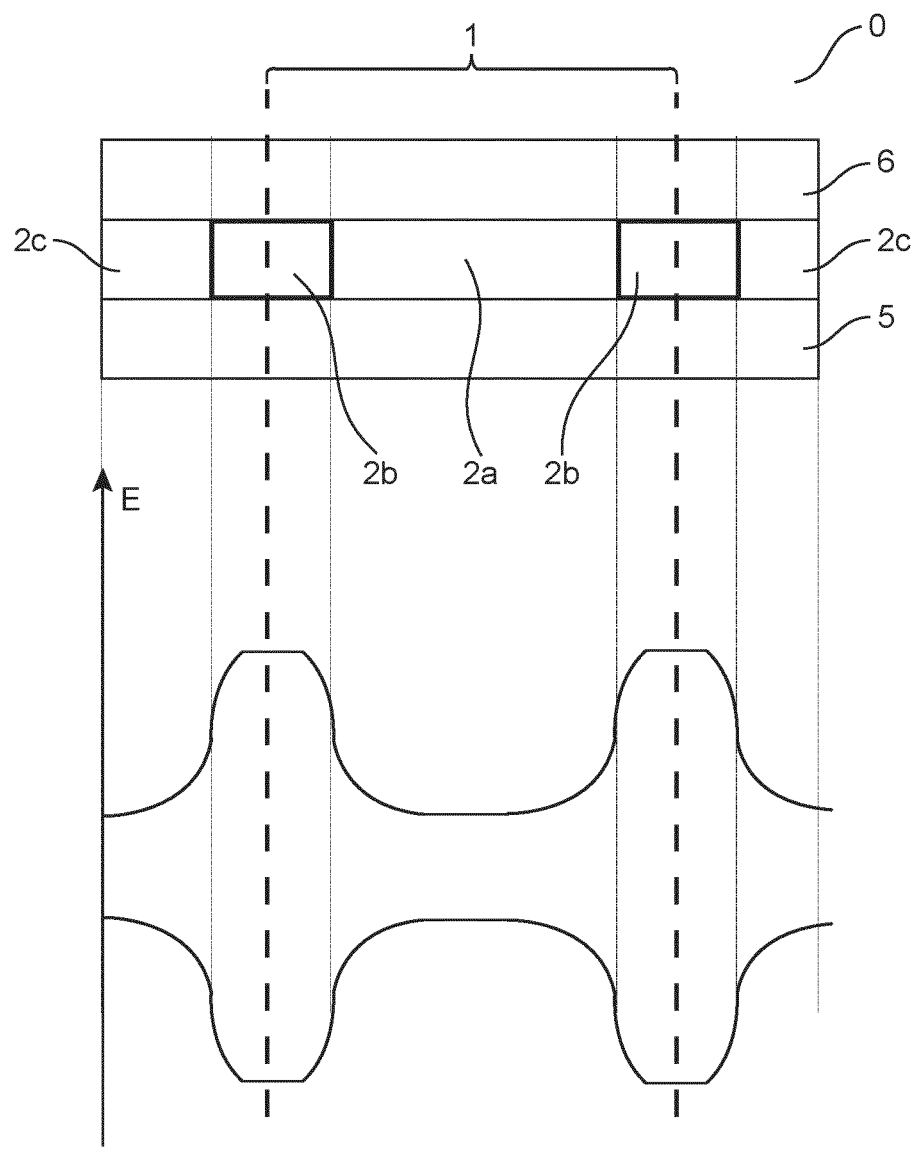
FIG. 11 is a representation of the band gap of the semiconductor structure according to the proposed concept.

FIG. 11 shows the layer structure of the semiconductor structure 0 after application of the mask or mask segments 7 and diffusion of the second dopant b as well as the band gap of the at least one quantum well in the active layer 2. The energy of the band gap E in the vertical direction of the diagram is shown over the cross-section of the semiconductor structure 0 in the horizontal direction of the diagram.

Viewed from left to right, the energy of the band gap E is essentially constant in the third area 2c and increases in a defined transition area from the third area 2c to the second area 2b. In the second region 2b, the energy of the bandgap E again has a constant value and then drops in a defined transition region from the second region 2b toward the first optically active region 2b, where the energy of the bandgap E of the first optically active region 2a assumes a constant value. In a mirrored manner, corresponding to this course, there is an increase of the energy of the band gap E in a defined transition region from the first optically active region 2a to the second region 2b and a decrease of the energy of the band gap E in a defined transition region from the second region 2b to the third region 2c.

However, the depicted variation of the energy of the band gap E may vary and does not represent absolute values or ratios between the energy of the band gap E in the first optically active regions 2a, the at least one second region 2b, and the at least one third region 2c. Likewise, the transition region between the at least one second region 2b and the first optically active regions 2a and the transition region between the at least one second region 2b and the at least one third region 2c may also vary and be both somewhat shallower and steeper.

Decisive Ifigur
st only that the energy of the band gap E of the first optically active regions 2a and the at least one third region 2c is smaller than that of the at least one second region 2b, and that the energy of the band gap E in each of the first optically active regions 2a and the at least one second region 2b is substantially constant along the circumference of the region 2a.

The invention claimed is:

1. A method of manufacturing an optoelectronic device, in particular a light-emitting diode, comprising:
    providing a semiconductor structure comprising an n-doped layer, a p-doped layer, and an active layer disposed therebetween having at least one quantum well, wherein the p-doped layer comprises a first dopant;
    depositing and patterning of a mask on the semiconductor structure; and
    doping the p-doped layer with a second dopant, including Zn or Mg, so that quantum well intermixing is produced in regions of the active layer over which there is no region of patterned mask;
    wherein the doping of the p-doped layer with the second dopant is performed by a gas phase diffusion using a precursor with the second dopant and comprises:
        depositing the second dopant on a surface of the p-doped layer by decomposing the precursor at a first temperature selected such that substantially no diffusion of the second dopant occurs into the p-doped layer occurs; and
        diffusing the deposited second dopant into the p-doped layer at a second temperature higher than the first temperature.

2. The method of claim 1, wherein an amount of the deposited second dopant is selected such that it diffuses substantially completely into the p-doped layer during diffusion.

3. The method of claim 1, wherein an amount of the second dopant is selected such that, in regions of the active layer not covered by a region of the patterned mask, a lateral diffusion barrier of charge carriers created by the second dopant is greater than a barrier created by quantum well intermixing.

4. The method of claim 1, wherein the doping of the p-doped layer with the second dopant comprises annealing the semiconductor structure after diffusion of the second dopant into the p-doped layer at a third temperature higher than the second temperature.

5. The method of claim 4, wherein the mask is locally formed by a suitable layer of the semiconductor structure by patterning.

6. The method of claim 4, wherein the annealing comprises:

providing a further precursor comprising an element from a fifth main group, including P or As; and/or
    depositing a layer of a III-V semiconductor material on the surface of the p-doped layer.

7. The method of claim 4, wherein, during the depositing, the diffusing, and the annealing, at least one parameter is selected differently, the at least one parameter comprising at least one of:
    a temperature change over a first defined period of time during one of the depositing, the diffusing, and the annealing;
    a pressure;
    a pressure change over a second defined period of time during one of the depositing, the diffusing, and the annealing;
    a composition of a gas; or
    a combination thereof.

8. A semiconductor structure, comprising:
    an n-doped layer;
    a p-doped layer doped with a first dopant; and
    an active layer disposed between the n-doped layer and the p-doped layer and having at least one quantum well, wherein the active layer of the semiconductor structure is divided into a plurality of first optically active regions, at least one second region, and at least one third region;
    wherein the plurality of first optically active regions are spaced apart in a hexagonal pattern;
    wherein the at least one quantum well in the active layer comprises a larger band gap in the at least one second region than in the plurality of first optically active regions and the at least one third region;
    wherein the larger band gap is modified by quantum well intermixing;
    wherein the at least one second region encloses the plurality of first optically active regions; and
    wherein the at least one third region is disposed in spaces between the plurality of first optically active regions.

9. The semiconductor structure of claim 8, wherein the at least one second region and the at least one third region comprise a plurality of second regions and a plurality of third regions, respectively, wherein at least one of the plurality of first optically active regions, the plurality of second regions, and each of the plurality of third regions are substantially circular in shape.

10. The semiconductor structure of claim 8, wherein the at least one second region comprises a plurality of second regions, wherein the plurality of second regions each concentrically surrounds one of the plurality of first optically active regions.

11. The semiconductor structure of claim 10, wherein the at least one third region comprises a plurality of third regions, wherein the plurality of third regions are arranged such that each of the plurality of third regions is located at a center of exactly three of the plurality of first optically active regions.

12. The semiconductor structure of claim 8, wherein the at least one second region and the at least one third region comprise a plurality of second regions and a plurality of third regions, respectively, wherein each of the plurality of third regions maps substantially to a shape of a deltoid curve formed by exactly three of the plurality of second regions, respectively, which are substantially circular in shape.

13. The semiconductor structure of claim 8, further comprising a second dopant substantially uniformly disposed in the at least one second region.

14. The semiconductor structure of claim 13, wherein the second dopant is present in at least a second region in the p-doped layer and/or in the active layer and/or at least partially in a region of the n-doped layer adjacent to the active layer.

15. The semiconductor structure of claim 13, wherein the second dopant is different from the first dopant.

16. The semiconductor structure of claim 13, wherein the second dopant is formed from a group comprising at least one of Mg, Zn, and/or Cd.

17. The semiconductor structure of claim 8, wherein the at least one second region comprises a substantially uniform bandgap modified by quantum well intermixing.

18. The semiconductor structure of claim 8, wherein the plurality of first optically active regions and the at least one third region comprise a substantially identical bandgap.

19. The semiconductor structure of claim 8, wherein the plurality of first optically active regions comprises substantially no quantum well intermixing and/or the at least one third region comprises substantially no quantum well intermixing.

20. The semiconductor structure of claim 8, wherein quantum well intermixing decreases in a defined transition region from the at least one second region to the plurality of first optically active regions.

21. A method of manufacturing a semiconductor structure, comprising:
    providing a semiconductor structure having an n-doped layer, a p-doped layer doped with a first dopant, and an active layer disposed therebetween;
    applying a mask to the p-doped layer to define a plurality of first optically active regions in the active layer surrounded by at least one second region of the active layer and to define at least one third region disposed in interstices between the plurality of first optically active regions; and
    generating quantum well intermixing in the at least one second region of the active layer.

22. The method of claim 21, wherein generating quantum well intermixing comprises diffusing a second dopant into the p-doped layer, into the active layer in the at least one second region, and at least partially into a region of the n-doped layer adjacent to the active layer.

23. The method of claim 21, wherein quantum well intermixing occurs only in the at least one second region due to application of the mask to the p-doped layer and due to diffusion of the first dopant into the p-doped layer, into the active layer in the at least one second region, and at least partially in a region of the n-doped layer adjacent to the active layer.

24. The method of claim 22, wherein the second dopant is different from the first dopant and is formed from a group comprising at least one of Mg, Zn, or Cd.

25. The method of claim 21, further comprising separating, including by an etching process, of individual optoelectronic components.

* * * * *